US010825684B2

(12) United States Patent
Chang et al.

(10) Patent No.: US 10,825,684 B2
(45) Date of Patent: *Nov. 3, 2020

(54) MATERIAL COMPOSITION AND METHODS THEREOF

(71) Applicant: Taiwan Semiconductor Manufacturing Co., Ltd., Hsin-Chu (TW)

(72) Inventors: Shu-Hao Chang, Taipei (TW); Chien-Chih Chen, Taipei (TW); Kuo-Chang Kau, Miaoli County (TW); Jeng-Horng Chen, Hsin-Chu (TW); Pi-Yeh Chia, Yilan County (TW); Chi-Ren Chen, Yilan County (TW); Ying-Chih Lin, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 212 days.

This patent is subject to a terminal disclaimer.

(21) Appl. No.: 15/400,842

(22) Filed: Jan. 6, 2017

(65) Prior Publication Data

US 2017/0271150 A1  Sep. 21, 2017

Related U.S. Application Data

(60) Provisional application No. 62/310,421, filed on Mar. 18, 2016.

(51) Int. Cl.
*G03F 7/004* (2006.01)
*H01L 21/027* (2006.01)
*H01L 21/033* (2006.01)
*H01L 21/768* (2006.01)
*G03F 7/11* (2006.01)
*G03F 7/16* (2006.01)
*G03F 7/20* (2006.01)
*G03F 7/38* (2006.01)
*G03F 7/039* (2006.01)
*G03F 7/038* (2006.01)
*G03F 7/26* (2006.01)

(52) U.S. Cl.
CPC .......... *H01L 21/0274* (2013.01); *G03F 7/038* (2013.01); *G03F 7/039* (2013.01); *G03F 7/11* (2013.01); *G03F 7/162* (2013.01); *G03F 7/168* (2013.01); *G03F 7/2004* (2013.01); *G03F 7/26* (2013.01); *G03F 7/38* (2013.01); *H01L 21/0332* (2013.01); *H01L 21/76892* (2013.01)

(58) Field of Classification Search
CPC .... G03F 7/0044; G03F 7/0043; G03F 7/0042; G03F 7/2004; H01L 21/0332
See application file for complete search history.

(56) References Cited

U.S. PATENT DOCUMENTS

| | | | |
|---|---|---|---|
| 8,216,767 B2 | 7/2012 | Wang et al. | |
| 8,323,870 B2 | 12/2012 | Lee et al. | |
| 8,580,117 B2 | 11/2013 | Kao et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272686 A1* | 9/2014 | Lu | G03F 1/38 430/5 |
| 2014/0272709 A1 | 9/2014 | Liu et al. | |
| 2014/0272726 A1 | 9/2014 | Chang | |
| 2014/0273521 A1 | 9/2014 | Wu et al. | |
| 2015/0079393 A1* | 3/2015 | Freedman | G03F 7/0042 428/402 |
| 2018/0315617 A1* | 11/2018 | Zi | H01L 21/3213 |

FOREIGN PATENT DOCUMENTS

WO    WO2016/020650    *  2/2016  ............. G03F 7/004

* cited by examiner

*Primary Examiner* — Daborah Chacko-Davis
(74) *Attorney, Agent, or Firm* — Haynes and Boone, LLP

(57) ABSTRACT

Provided is a material composition and method for that includes providing a substrate and forming a resist layer over the substrate. In various embodiments, the resist layer includes a multi-metal complex including an extreme ultraviolet (EUV) absorption element and a bridging element. By way of example, the EUV absorption element includes a first metal type and the bridging element includes a second metal type. In some embodiments, an exposure process is performed to the resist layer. After performing the exposure process, the exposed resist layer is developed to form a patterned resist layer.

20 Claims, 36 Drawing Sheets

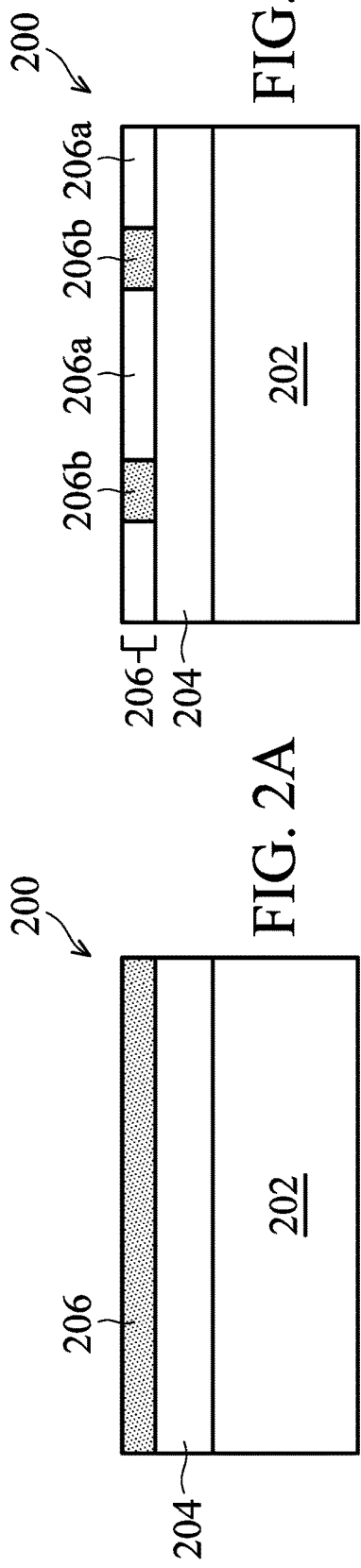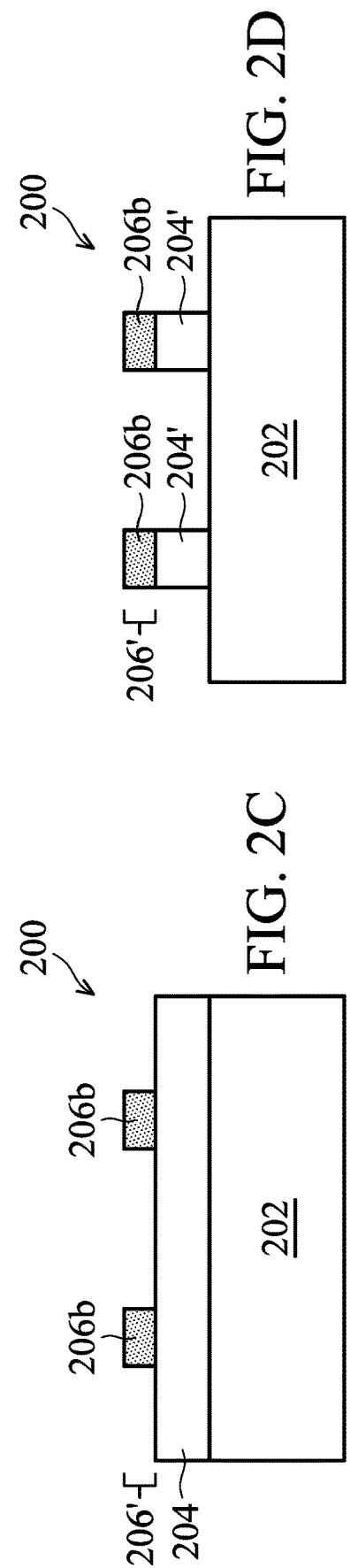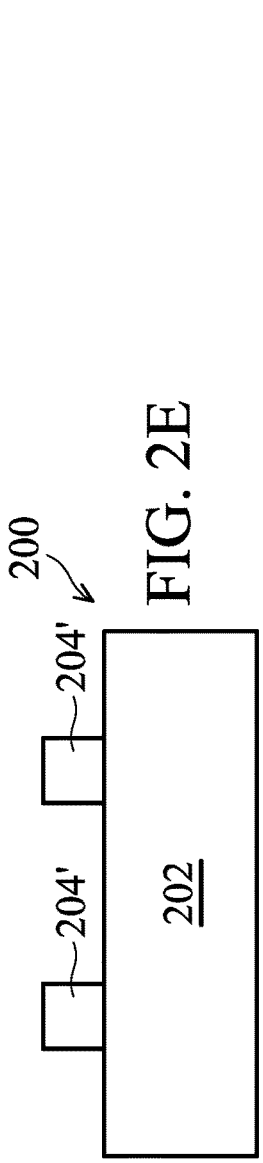

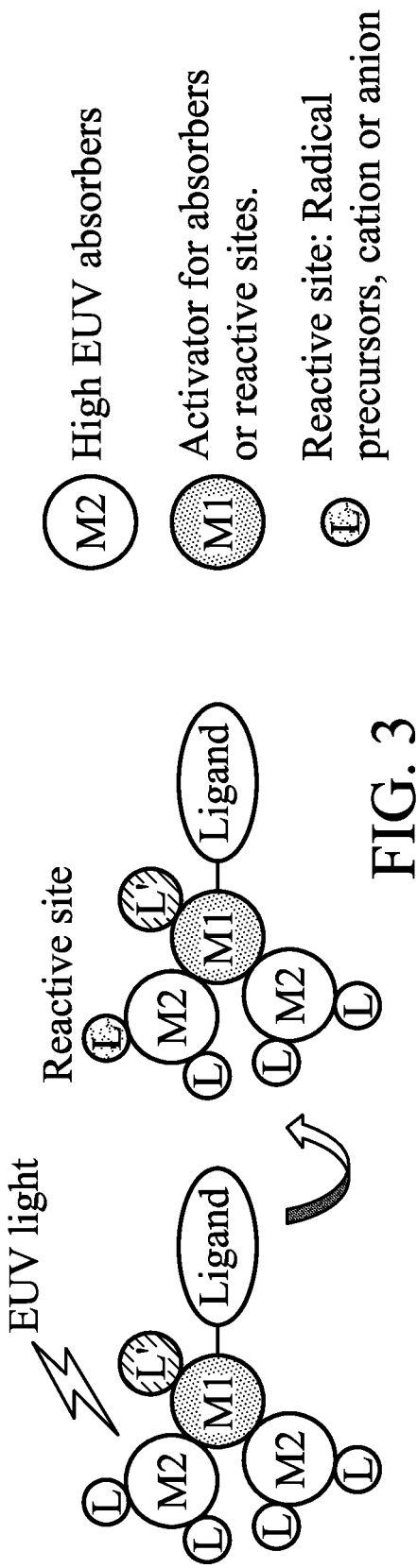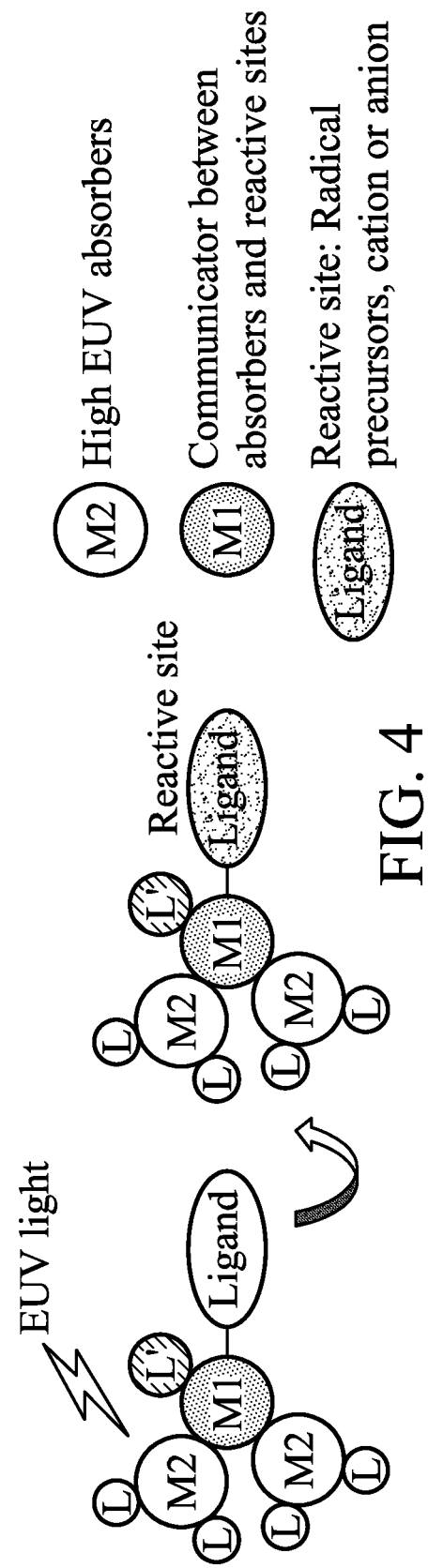

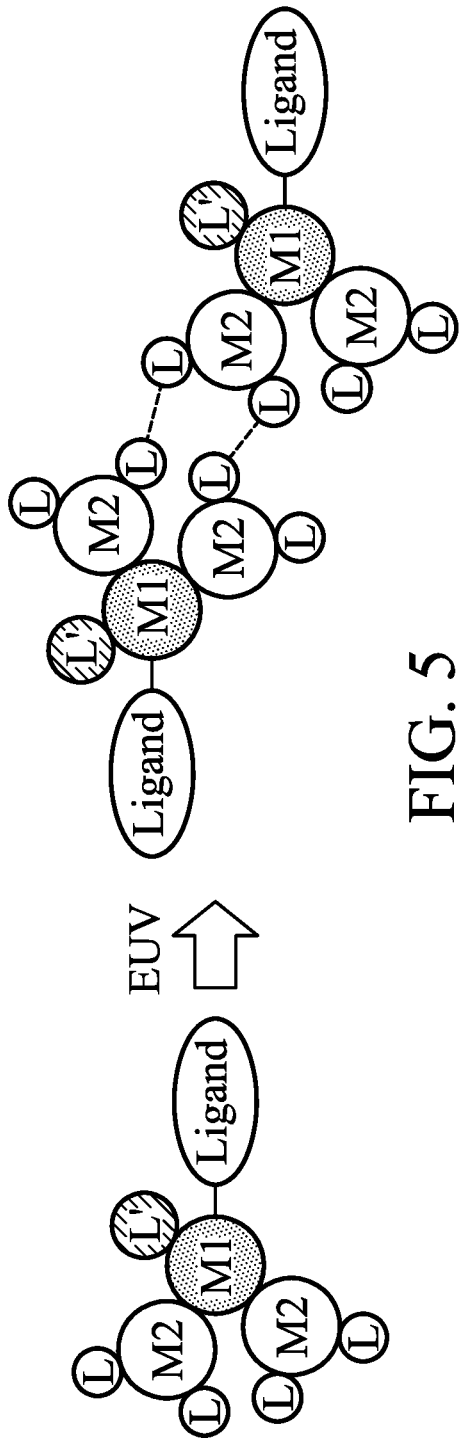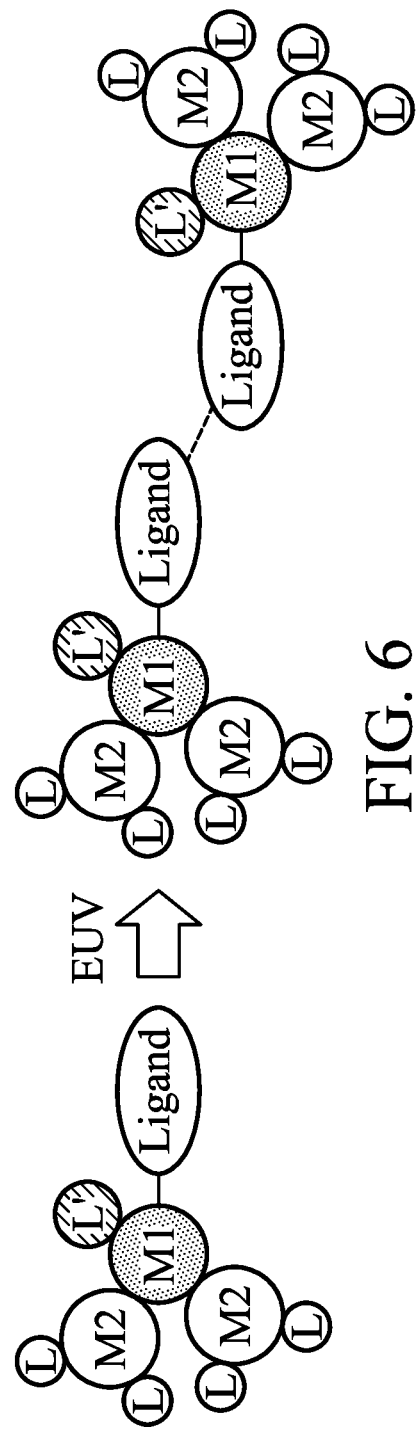
FIG. 5
FIG. 6

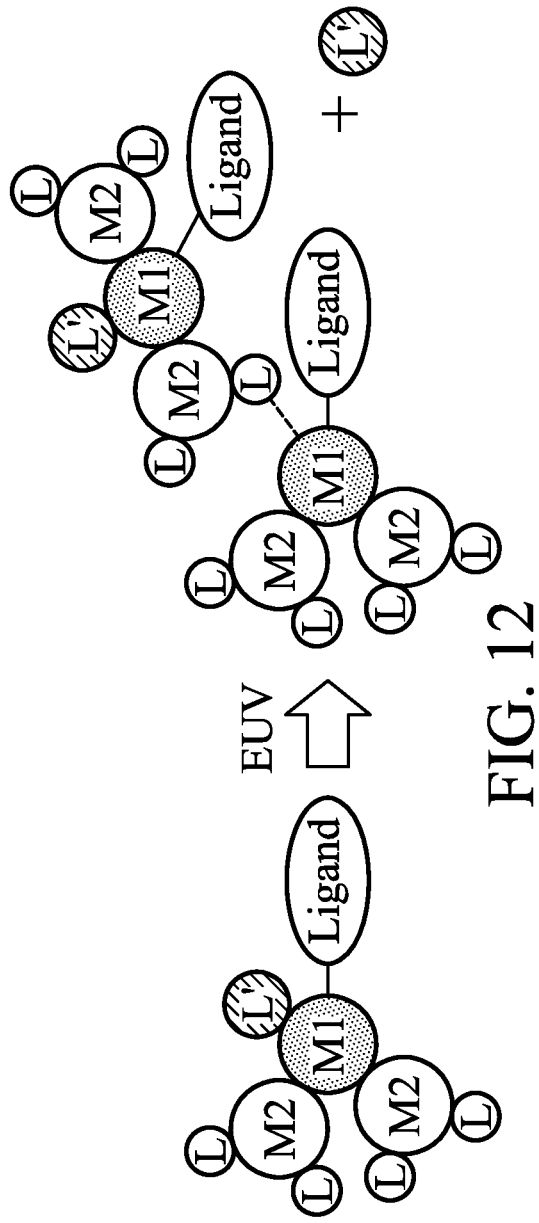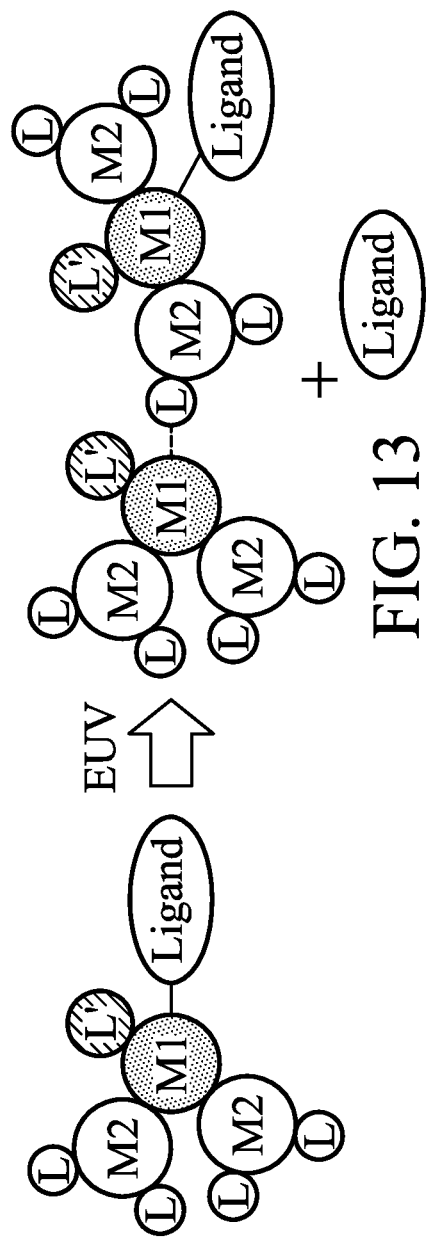
FIG. 12
FIG. 13

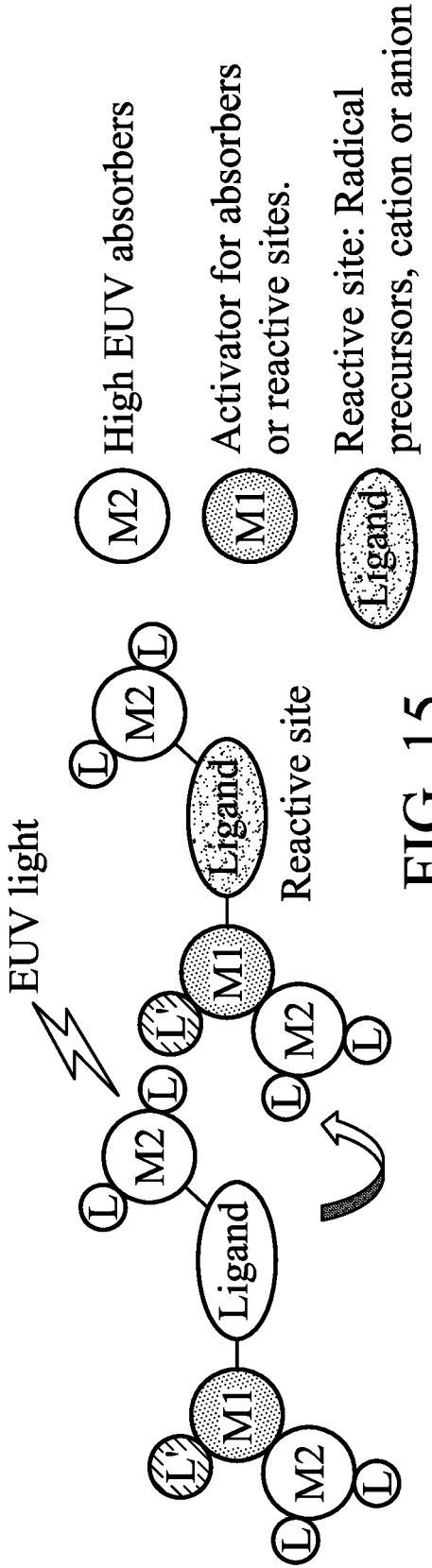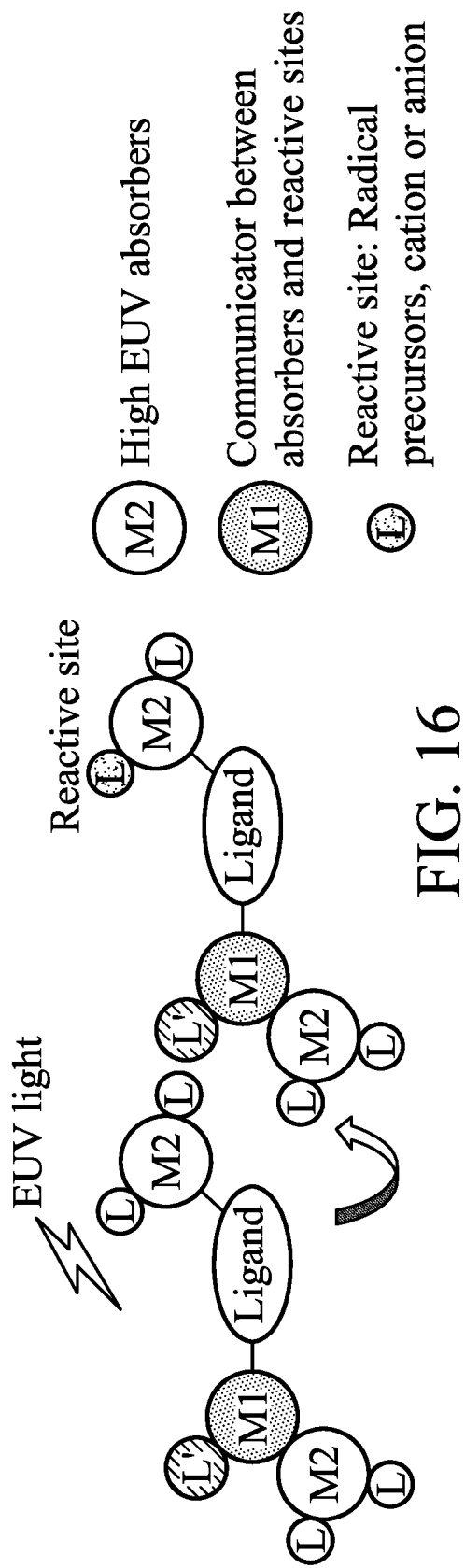
FIG. 15
FIG. 16

Crosslinking reactions - multi-metal complexes (Type II)

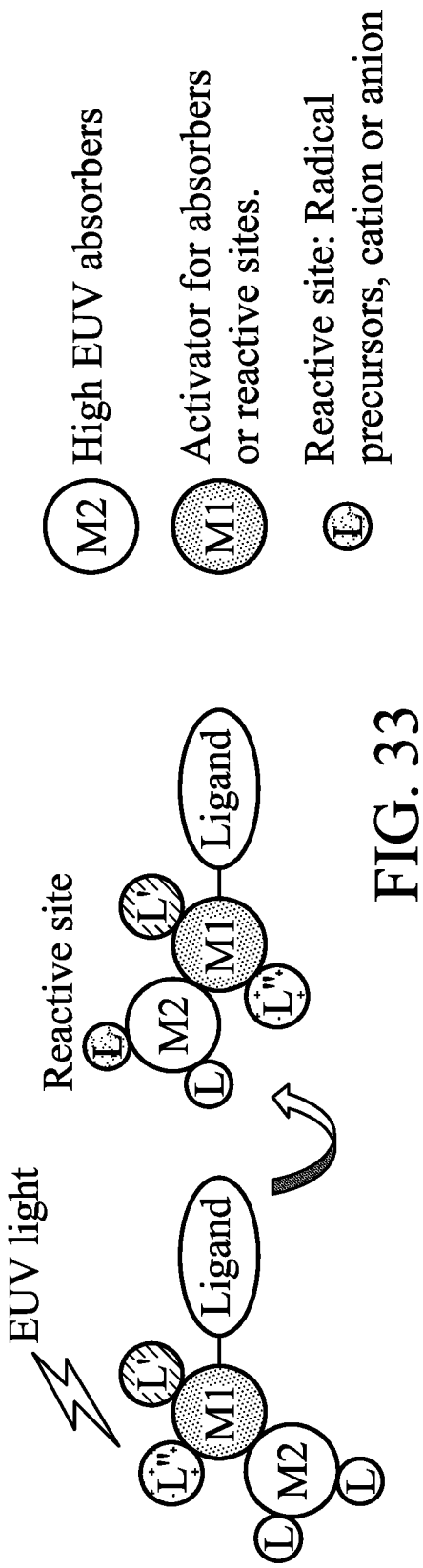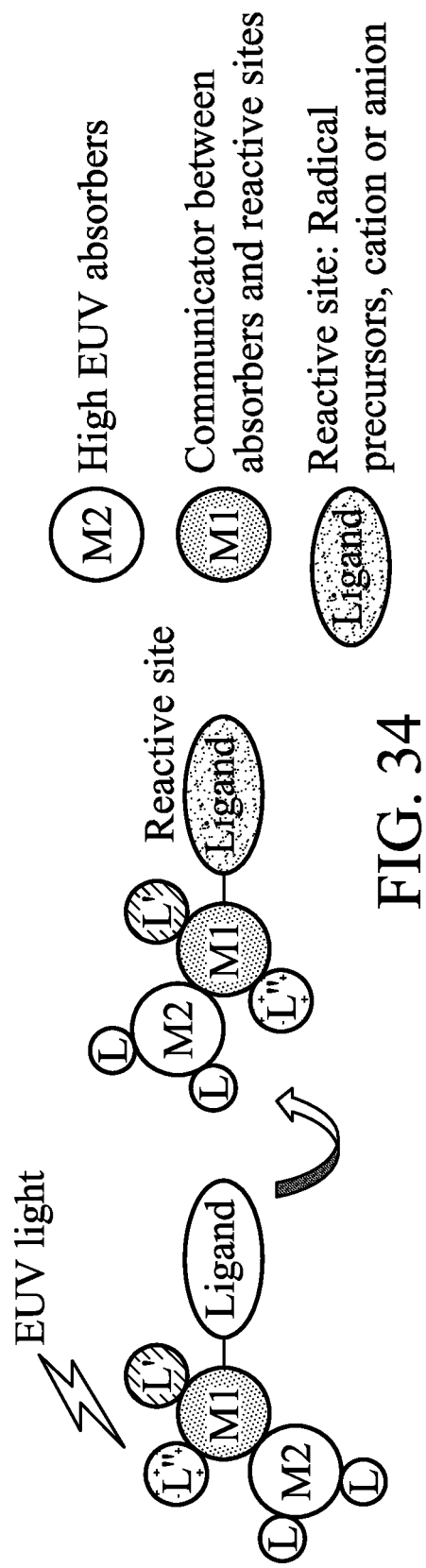
FIG. 33
FIG. 34

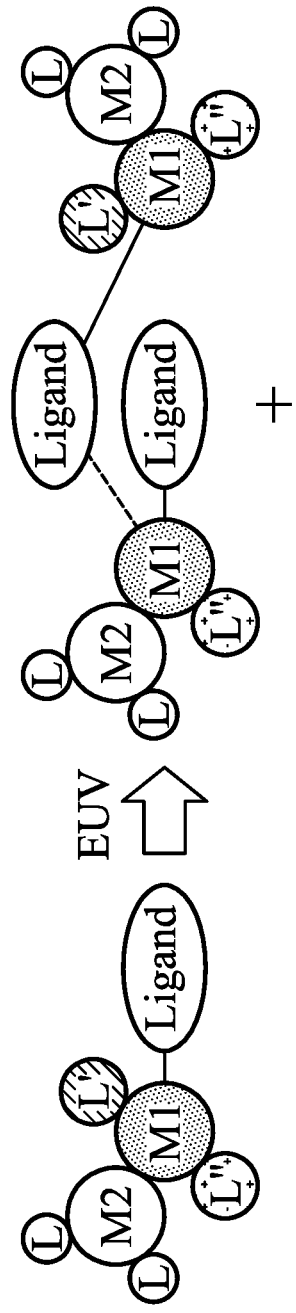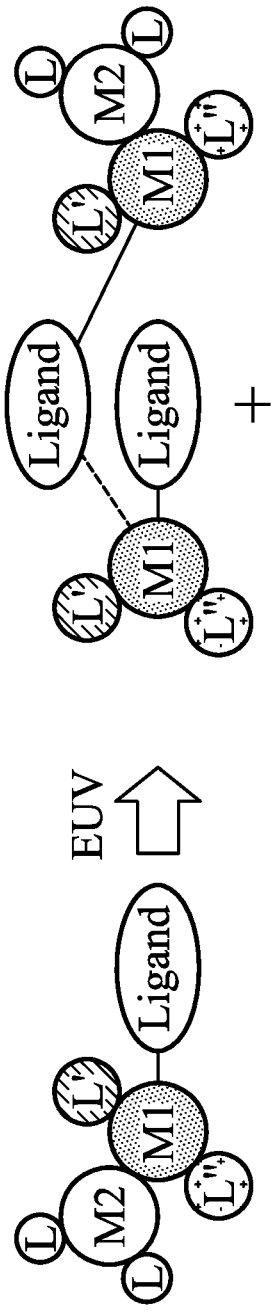
FIG. 40
FIG. 41

Example 6: Reactions of cyclopropanes

MATERIAL COMPOSITION AND METHODS THEREOF

CROSS-REFERENCE TO RELATED APPLICATION

This application claims the benefit of U.S. Provisional Application No. 62/310,421, filed Mar. 18, 2016.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Generally, the minimum feature size of a given semiconductor IC is a function of the wavelength of a radiation source used in a lithography process, as well as a resist composition and resist selectivity, among other factors. As semiconductor lithography has progressed, the wavelength of the radiation source used has decreased, and the radiation source itself may be relatively weak, such that photoresists have been designed to utilize radiation sources as efficiently as possible. As one example, chemically amplified photoresist (CAR) compositions have been introduced in an effort to increases a resist's sensitivity to an exposing light source. However, CAR systems have encountered limitations which are difficult to overcome, such as poor photon absorption in thin films, moderate etch selectivity, and limited gains in resolution. Moreover, the need for photoresists with high resolution, low line width roughness (LWR), and high sensitivity has increased more rapidly than the capability provided by such CAR systems. As such, chemically amplified resists may not be able to satisfy the next generation lithography requirements demanded by the continued advances in semiconductor technology.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2E provide cross-sectional views of a semiconductor structure 200 at various fabrication stages, constructed in accordance with the method of FIG. 1;

FIGS. 3-14 illustrate therein are metal and ligand functions, as well as crosslinking and replacement reactions, for a first type of multi-metal complex used for a resist layer, according to some embodiments;

FIGS. 15-25 illustrate therein are metal and ligand functions, as well as crosslinking and replacement reactions, for a second type of multi-metal complex used for the resist layer, according to some embodiments;

FIGS. 33-44 illustrate therein are metal and ligand functions, as well as crosslinking and replacement reactions, for a fourth type of multi-metal complex used for the resist layer, according to some embodiments;

DETAILED DESCRIPTION

Figure 1:
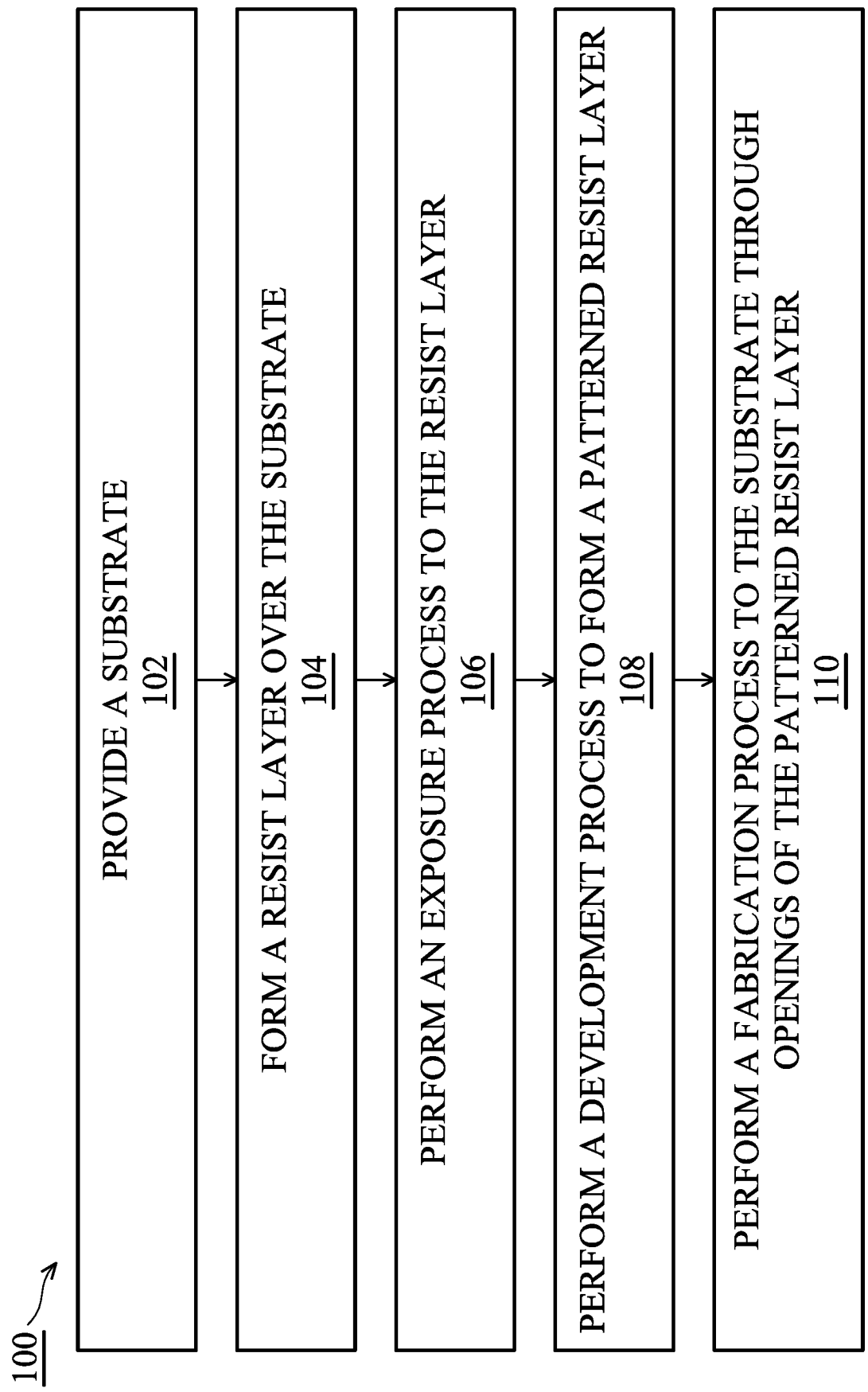
FIG. 1 illustrates a flow chart of a method for patterning a substrate, according to various embodiments.
Figure 7:
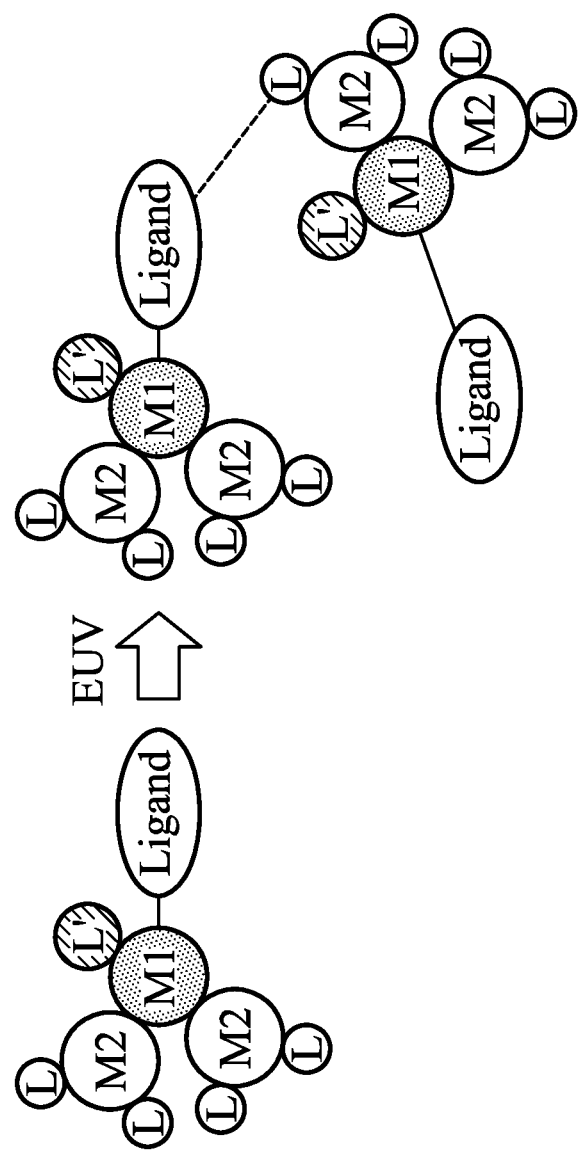

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to photoresist (resist) material compositions and/or complexes in extreme ultraviolet (EUV) lithography and methods of using the same. In some cases, the embodiments shown and described herein may also be used for deep UV (DUV) and electron beam (e-beam) lithography. Additionally, the various embodiments presented herein may be used to increase a resist sensitivity (e.g., to a DUV, UV, or e-beam radiation source). Generally, lithographic patterning includes coating a substrate with a resist film, exposing the resist film to a radiation source (e.g., DUV, UV, or e-beam radiation source), and developing the exposed resist in a developer (a chemical solution). The developer removes portions of the exposed resist, such as exposed portions of a positive-tone resist or unexposed portions of a negative-tone resist, thereby forming a patterned resist layer. The patterned resist layer may then be used as an etch mask in a subsequent etching processes, transferring the pattern of the patterned resist layer to an underlying material layer. Alternatively, the resist pattern may be used as an ion implantation mask in a subsequent ion implantation process applied to the underlying material layer, such as an epitaxial semiconductor layer.

In general, the minimum feature size of a given semiconductor IC is a function of the wavelength of the radiation source used in the lithography process, as well as the resist composition and resist selectivity, among other factors. As semiconductor lithography has progressed, the wavelength of the radiation source used has decreased, for example from 248 nm (e.g., for a KrF laser) to 193 nm (e.g., for an ArF laser) for DUV lithography, and to 13.5 nm for EUV lithography. Radiation sources (light sources) used to produce these wavelengths of light may be relatively weak, such that photoresists have been designed to utilize these light sources as efficiently as possible. Conventionally, this goal has been achieved in part by the use of chemically amplified photoresists, where such chemical amplification increases a resist's sensitivity to the exposing light source. Currently, most semiconductor companies use chemically amplified resists (CAR) for high-volume manufacturing (HVM). Chemically amplified resists have been used for 248 nm (e.g., for a KrF laser) and 193 nm (e.g., for an ArF laser) DUV lithography, as well as for 13.5 nm EUV lithography. However, CAR systems have encountered limitations which are difficult to overcome, such as poor photon absorption in thin films, moderate etch selectivity, and limited gains in resolution. Moreover, the need for photoresists with high resolution, low line width roughness (LWR), and high sensitivity has increased more rapidly than the capability provided by such resist systems. Considering the example of EUV chemically amplified resists, there is no high EUV absorption element in the composition of the EUV CAR. Therefore, the sensitivity of an EUV CAR may be low. While there may still be ways in which to improve the sensitivity of CAR systems, LWR and resolution may suffer due to the "RLS tradeoff", which states that it is very difficult to simultaneously improve resolution, LWR, and sensitivity. As such, chemically amplified resists may not be able to satisfy the next generation lithography requirements demanded by the continued advances in semiconductor technology.

Embodiments of the present disclosure offer advantages over the existing art, though it is understood that other embodiments may offer different advantages, not all advantages are necessarily discussed herein, and no particular advantage is required for all embodiments. Generally, and in accordance with embodiments disclosed herein, a better way to improve resist performance by using lithographic light sources (e.g., EUV light) more efficiently is provided. For example, in some embodiments, a non-CAR, multi-metallic resist (e.g., such as an EUV resist) is provided, where the multi-metallic resist provides for improved light absorption (e.g., EUV light absorption) while also increasing the etch selectivity of the multi-metallic resist. In some embodiments, a multi-metal complex is used as a resist center to increase the EUV absorption of the resist. Some examples of metal-containing and/or non-CAR EUV resists have been described, for example, such as described by Passarelli et al., "Organometallic carboxylate resists for extreme ultraviolet with high sensitivity", J. Micro/Nanolith. MEMS MOEMS. 14(4), 043503 (Oct. 14, 2015); as described by Trikeriotis et al., "Development of an inorganic photoresist for DUV, EUV, and electron beam imaging", Proc. SPIE 7639, Advances in Resist Materials and Processing Technology XXVII, 76390E (26 Mar. 2010); and as described by Toriumi et al., "Metal resist for extreme ultraviolet lithography characterized by scanning transmission electron microscopy", Applied Physics Express 9, 031601 (2016), the contents of which are hereby incorporated by reference in their entirety. However, embodiments disclosed herein provide a resist composition including more than one metal atom (e.g., such as more than one Sb atom) to increase the EUV light absorption of the non-CAR multi-metallic EUV resist, thereby improving the sensitivity of the resist. In particular, the present disclosure provides at least five types of multi-metal complexes useful for resist formation (e.g., EUV resist formation), as described below. In some embodiments, the multi-metal complex includes metal atoms that attach to one another. In some cases, the multi-metal complex includes metal atoms that attach to one another through an ionic bond. In some embodiments, the multi-metal complex includes some metal atoms that attach to each other and some metal atoms that separate through ligands. In some cases, the multi-metal complex includes all the metal atoms separated through ligands. As mentioned above, at least some advantages of the embodiments disclosed herein include improvement of EUV resist sensitivity and high etch selectivity. In addition, in some embodiments, secondary electrons generated by EUV absorption may transfer through chemical bonds and space.

It is also noted that the material compositions, metal complexes, and methods of the present disclosure are not limited to a particular substrate type, mask type, resist type, radiation source (e.g., radiation wavelength), and/or lithography system type. For example, the material compositions, metal complexes, and methods may be applied to features and/or devices patterned on a variety of substrate materials such as silicon, germanium, silicon carbide (SiC), silicon germanium (SiGe), diamond, compound semiconductors, alloy semiconductors, and the substrate may optionally include one or more epitaxial layers (epi-layers), may be strained for performance enhancement, may include a silicon-on-insulator (SOI) structure, and/or have other suitable enhancement features. Embodiments of the present disclosure may further be applicable to processes employing reflective masks (e.g., such as used for extreme ultraviolet (EUV) lithography), transmissive masks, binary intensity masks, phase-shifting masks, as well as other mask types known in the art. In some examples, embodiments disclosed herein may be applied to processes employing various types of resist such as poly(methyl methacrylate) (PMMA), SU-8, an EUV resist, a positive-tone resist, a negative-tone resist, or other types of resist as known in the art. Additionally, embodiments of the present disclosure are applicable to various lithography system/aligner types such as a contact aligner, a proximity aligner, a projection aligner, or an EUV lithography system. Thus, embodiments of the present disclosure may further be applicable to systems employing any of a variety of radiation sources (radiation wavelengths) such as UV light, deep UV (DUV) light, EUV light, or other radiation sources as known in the art.

Referring first to FIG. 1, illustrated therein is a flow chart of a method 100 for patterning a substrate (e.g., a semiconductor wafer), according to various embodiments. The method 100 may be implemented, in whole or in part, by a system employing advanced lithography processes such as deep ultraviolet (DUV) lithography, extreme ultraviolet (EUV) lithography, electron beam (e-beam) lithography, X-ray lithography, and/or other lithography processes to improve pattern dimension accuracy. In the present embodiment, EUV and/or e-beam lithography is used as the primary example. It is understood that additional operations can be provided before, during, and after the method 100, and some operations described can be replaced, eliminated, or moved around for additional embodiments of the method. It is also noted that the method 100 is exemplary, and is not intended to limit the present disclosure beyond what is explicitly recited in the claims that follow. The method 100 will be further described below in conjunction with FIGS. 2A-2E.

In particular, FIGS. 2A-2E provides cross-sectional views of a semiconductor structure 200 at various fabrication stages, constructed in accordance with some embodiments. The method 100 is described below in conjunction FIGS. 2A-2E, where the semiconductor structure 200 is fabricated by using embodiments of the method 100. The semiconductor device 200 may be an intermediate device fabricated during processing of an IC, or a portion thereof, that may include logic circuits, memory structures, passive components (such as resistors, capacitors, and inductors), and active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 100 begins at block 102 where a substrate is provided. With reference to the example of FIG. 2A, in an embodiment of block 102, illustrated therein is a cross-section view of the semiconductor structure 200 including a substrate 202. In some embodiments, the substrate 202 may include a semiconductor substrate, as described above, and the substrate 202 may include various layers, including conductive or insulating layers formed on the substrate 202, an organic layer, and/or various enhancement features, as previously described. The substrate 202 may also include various doping configurations depending on design requirements as is known in the art.

In some embodiments, the substrate 202 includes an underlayer (or material layer) 204 to be processed, such as to be patterned or to be implanted. For example, the underlayer 204 may include a hard mask layer to be patterned. In some cases, the underlayer 204 may include an epitaxial semiconductor layer to be ion implanted. However, in some embodiments, the substrate 202 may not include an underlayer and an underlayer (e.g., 204) is instead optionally formed over the substrate 202. In an embodiment, the underlayer 204 may include a hard mask layer including material(s) such as silicon oxide, silicon nitride (SiN), silicon oxynitride, titanium nitride, or other suitable material or composition. In some embodiments, the underlayer 204 may include an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In various embodiments, the underlayer 204 may include a high-k dielectric layer, a gate layer, a hard mask layer, an interfacial layer, a capping layer, a diffusion/barrier layer, a dielectric layer, a conductive layer, other suitable layers, and/or combinations thereof.

In some embodiments, the structure 200 may alternatively include a mask used to pattern a semiconductor wafer. Thus, in some embodiments, the substrate 202 may include a mask substrate that may include a transparent material (such as quartz), or a low thermal expansion material such as silicon oxide-titanium oxide compound. The mask substrate 202 may further include a material layer to be patterned. In furtherance of this example, the substrate 202 may include a mask substrate for making a deep ultraviolet (DUV) mask, an extreme ultraviolet (EUV) mask, or other types of masks. Accordingly, in some embodiments, the underlayer 204 may include a material layer to be patterned to define a circuit pattern. For example, the underlayer 204 may include an absorber layer, such as a chromium layer.

Figure 56:
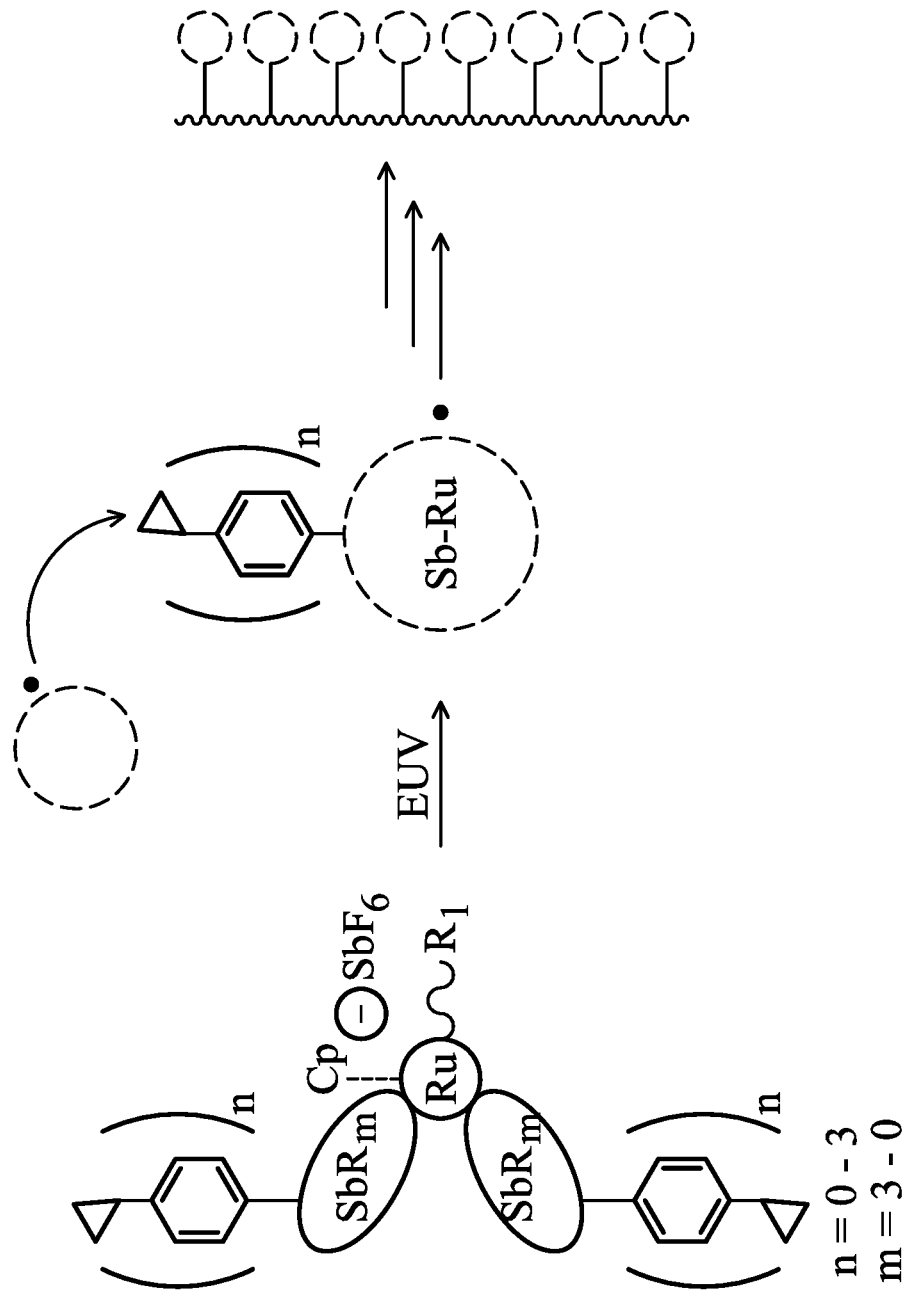

The method 100 proceeds to block 104 where a photoresist layer (or simply resist layer) 206 is formed over the substrate 202, or over the optional underlayer 204 (FIG. 2A). In various examples, the resist layer 206 includes a multi-metal complex, in accordance with the embodiments described herein. In addition, the resist layer 206 may include a non-CAR layer. The resist layer 206 is sensitive to radiation used in a lithography exposure process and has a resistance to etching processes (or ion implantation processes). In comparison to at least some current resist compositions, and as described in more detail below, the multi-metal complex containing resist layer 206 provides a resist (e.g., an EUV resist) having improved sensitivity and etch selectivity. In some embodiments, the resist layer 206 may be formed by a spin-on coating process. In some examples, prior to forming the resist layer 206, an adhesion layer (e.g., such as an HMDS layer) is formed over the substrate 202, or over the optional underlayer 204. In some embodiments, after formation of the resist layer 206, and prior to performing an exposure process, a pre-bake process may be performed, for example, to evaporate solvents and to densify the resist layer 206. In various embodiments, the resist layer 206 is sensitive to various types of radiation, such as DUV radiation (e.g., 248 nm radiation from a KrF laser or 193 nm radiation from an ArF laser), EUV radiation (e.g., 13.5 nm radiation), an electron beam (e-beam), or an ion beam. For purposes of the present example, the resist layer 206 is sensitive to EUV radiation. Details of various resist compositions and multi-metal complexes used for the resist layer 206 are discussed and/or illustrated in more detail below with respect to FIGS. 3-56. In some examples, the resist layer 206 is soluble in a positive tone developer or negative tone developer after being exposed by EUV radiation.

The method 100 proceeds to block 106 where a pattern is exposed onto the resist-coated substrate. With reference to the example of FIG. 2B, in an embodiment of block 106, illustrated therein is a cross-section view of the structure 200, where the resist layer 206 (FIG. 2A) has been exposed (e.g., by a lithographic imaging system) through an intervening mask. In some embodiments, the resist layer 206 is exposed by EUV radiation (e.g., 13.5 nm). Alternatively, in some embodiments, the resist layer 206 may be exposed by DUV radiation (e.g., from a 248 nm KrF excimer laser or a 193 nm ArF excimer laser), X-ray radiation, an e-beam, an ion beam, and/or other suitable radiation sources. In various example, the exposure of block 106 may be performed in air, in a liquid (e.g., immersion lithography), or in a vacuum (e.g., for EUV lithography and e-beam lithography). In some embodiments, the radiation beam is patterned with a mask, such as a transmissive mask or a reflective mask, which may include resolution enhancement features such as phase-shifting features and/or optical proximity correction (OPC), and which may be performed using off-axis illumination (OAI). In some other embodiments, the radiation beam is directly modulated with a predefined pattern, such as an IC layout, without using a mask (such as using a digital pattern generator or direct-write mode). In the present example, the radiation beam includes EUV radiation and the exposure of block 106 is performed in an EUV lithography system.

In some embodiments, after the exposure of block 106, a baking process may be performed. For example, in some embodiments, after exposure of the resist layer 206, and prior to performing a resist development process, a post-bake process may be performed to stabilize and harden the developed resist layer. In some examples, As a result of the exposure process of block 106, a latent pattern is formed in the resist layer 206. By way of example, the latent pattern refers to the exposed pattern on the resist layer 206, which will subsequently become a physical resist pattern, after a developing process. In various embodiments, the latent pattern of the resist layer 206 may include unexposed portions 206a and exposed portions 206b. In various embodiments, the exposed portions 206b of the resist layer 206 may be physically or chemically changed as a result of the exposure process of block 106. Additional details of how the resist layer 206 changes, in view of the exposure of block 106, are discussed below (e.g., with reference to FIGS. 3-56). In some embodiments, if a positive-tone resist has been used, the exposed portions 206b will be dissolved during a subsequent development process. In some cases, if a negative-tone resist has been used, the exposed portions 206b will become insoluble and a subsequent development process may instead dissolve the unexposed portions 206a.

The method 100 proceeds to block 108 where a development process is performed to form a patterned resist layer. With reference to the example of FIGS. 2B and 2C, in an embodiment of block 108, after formation of the latent image, including the unexposed and exposed portions 206a/206b, a resist development process is performed, resulting in a patterned resist layer 206'. In some embodiments, the resist development process includes a wet chemical development process, as known in the art. As discussed above, if a negative-tone resist has been used, the exposed portions 206b will become insoluble. Thus, referring to the example of FIG. 2C which shows the structure 200 after a development process, use of a negative-tone resist is illustrated.

The method 100 proceeds to block 110, where a fabrication process is performed to the substrate through openings of the patterned resist layer. For example, a fabrication process may be performed to the semiconductor structure 200 using the patterned resist layer 206' as a mask, such that the fabrication process is applied to the portions of the semiconductor structure 200 within the openings of the patterned resist layer 206' (e.g., the exposed regions of the underlayer 204), while other portions covered by the patterned resist layer 206' are protected from the fabrication process. In some embodiments, the fabrication process of block 110 may include an etching process applied to the underlayer 204 using the patterned resist layer 206' as an etch mask, thereby transferring the pattern from the patterned resist layer 206' to the underlayer 204. Alternatively, in some embodiments, the fabrication process of block 110 may include an ion implantation process applied to the semiconductor structure 200 using the patterned resist layer 206' as an ion implantation mask, thereby forming various doped features in the semiconductor structure 200 (e.g., within the underlayer 204).

As described above, and in the present examples, the underlayer 204 may include a hard mask layer. In furtherance of this example, the pattern of the patterned resist layer 206' may first be transferred to the underlayer 204 (e.g., the hard mask layer 204), forming a patterned hard mask layer 204' (FIG. 2D), then to other layers of the substrate 202. For example, the hard mask layer 204 may be etched through openings of the patterned resist layer 206' using a dry (plasma) etching process, a wet etching process, a combination thereof, and/or other etching methods. For example, a dry etching process may include an oxygen-containing gas, a fluorine-containing gas, a chlorine-containing gas, a bromine-containing gas, an iodine-containing gas, other suitable gases and/or plasmas, and/or combinations thereof. In some embodiments, the patterned resist layer 206' may be partially or completely consumed during the etching of the hard mask layer 204 and formation of the patterned hard mask layer 204'. In an embodiment, any portion of the patterned resist layer 206' remaining after the etching process may be stripped off, leaving a patterned hard mask layer 204' over the substrate 202, as illustrated in FIG. 2E.

The method 100 may include other steps before, during or after the steps described above. In an embodiment, the substrate 202 is a semiconductor substrate and the method 100 proceeds to forming fin field effect transistor (FinFET) devices. In such an example, the method 100 may further include forming a plurality of active fins in the semiconductor substrate 202. Additionally, and in furtherance of this example, the block 110 may further include etching the substrate 202 through the openings of the patterned hard mask 204' to form trenches in the substrate 202; filling the trenches with a dielectric material; performing a chemical mechanical polishing (CMP) process to form shallow trench isolation (STI) features; epitaxial growth and/or recessing of the STI features to form fin-like active regions. In some embodiments, the method 100 includes other steps to form a plurality of gate electrodes, gate spacers, doped source/drain regions, contacts for gate/source/drain features, etc. In some embodiments, subsequent processing may form various contacts/vias/lines and multilayers interconnect features (e.g., metal layers and interlayer dielectrics) on the substrate, configured to connect the various features to form a functional circuit that may include one or more devices (e.g., one or more FinFET devices). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Referring now to FIGS. 3-48, illustrated therein are some embodiments of multi-metal complexes used for the resist layer 206, which is some cases may be referred to as multi-metal resist complexes. In various embodiments, the multi-metal resist complexes provide an EUV resist, and as such, are sensitive to radiation such as EUV radiation. In particular, it is noted that while the reactions illustrated in the examples of FIGS. 3-48 are shown as being catalyzed by EUV radiation, in some cases the reactions may similarly respond to other types of radiation such as DUV, e-beam, X-ray, ion beam, or other type of radiation. In some embodiments, the resists of the present disclosure may include metal oxide nanoparticles, organic and/or inorganic molecules, molecular organometallic materials, or other materials as known in the art and/or described herein. Referring first to FIGS. 3-14, illustrated therein are metal and ligand functions, as well as crosslinking and replacement reactions, for a first type of multi-metal complex. Referring to FIGS. 15-25, illustrated therein are metal and ligand functions, as well as crosslinking and replacement reactions, for a second type of multi-metal complex. FIGS. 26-32 illustrate metal and ligand functions, as well as crosslinking and replacement reactions, for a third type of multi-metal complex. FIGS. 33-44 illustrate metal and ligand functions, as well as crosslinking and replacement reactions, for a fourth type of multi-metal complex. FIGS. 45-48 illustrate metal and ligand functions, as well as crosslinking and replacement reactions, for a fifth type of multi-metal complex.

In furtherance of the above examples, consider the multi-metal complex of FIG. 3, which shows a first metal 'M1' (e.g., a first metal atom), a second metal 'M2' (e.g., a second metal atom), and a plurality of ligands named as L, L', and Ligand. In various embodiments, the first metal 'M1' may include an activator for an absorber (e.g., an EUV absorber) or reactive sites. In at least one example, the first metal 'M1' may include ruthenium, although other metals are contemplated as described below. In some embodiments, the second metal 'M2' may include a high EUV absorber. In at least one example, the second metal 'M2' may include antimony, although other metals are contemplated as described below. In the various embodiments described herein, the first metal 'M1' may act as a bridge between metals (e.g., between two second metal 'M2' atoms), between a metal and a ligand, and/or between ligands. In some cases, while the second metal 'M2' may include a high EUV absorber, the first metal 'M1' may not include a high EUV absorber. However, the first metal 'M1', in addition to acting as a bridge, may further catalyze formation of reactive sites (e.g., reactive ligand site as shown in FIG. 3), thereby enabling the multi-metal complex to participate in a cross-linking reaction and/or making participation in a cross-linking reaction easier. In some cases, formation of a reactive site include formation of a reactive site suitable for a double-bond, and/or formation of a radical-containing site. Stated another way, embodiments disclosed herein may include a multi-metal complex having a bridging element (e.g., first metal) and an EUV absorption element (e.g., second metal), where the bridging element has a favorable catalytic property to make double-bond cross-linking reactions easier.

Figure 8:
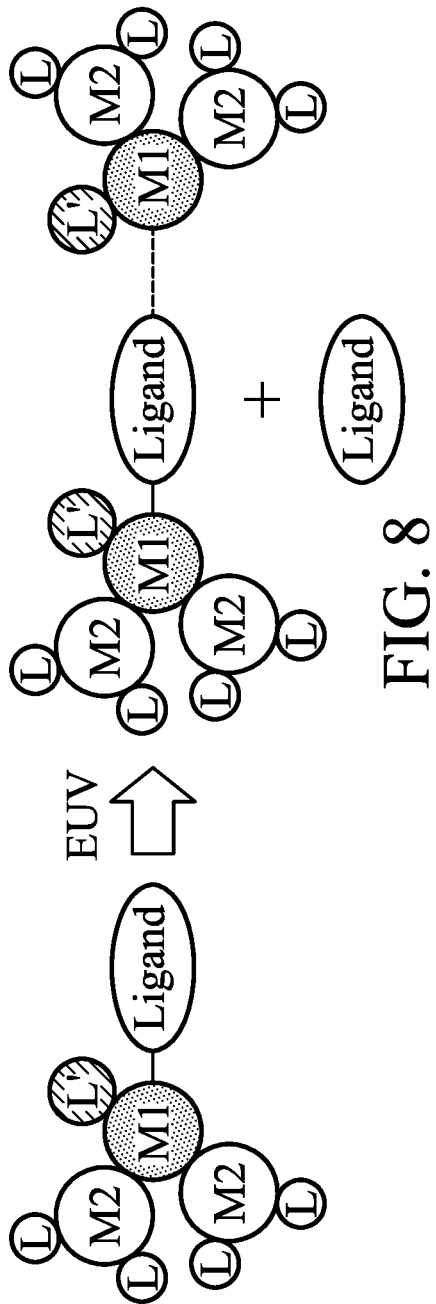
Figure 9:
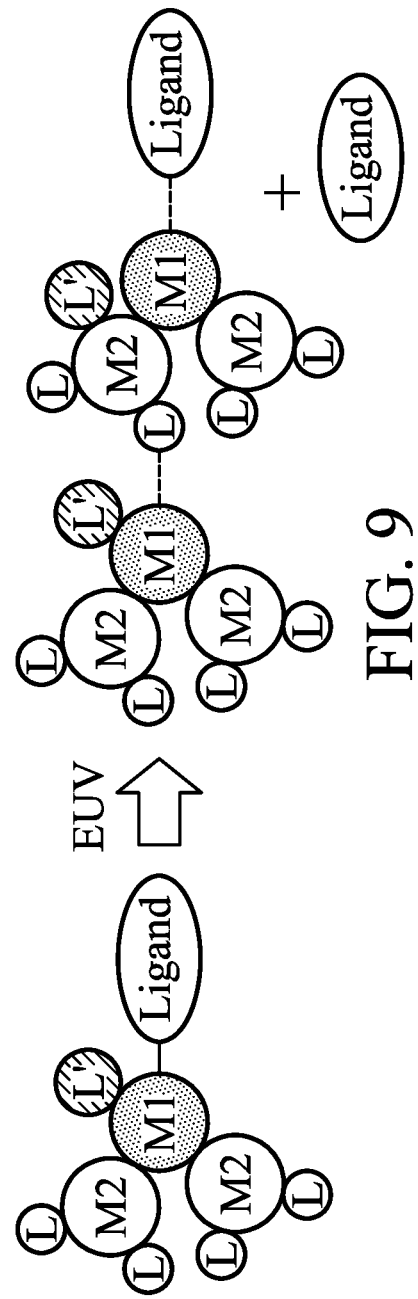
Figure 10:
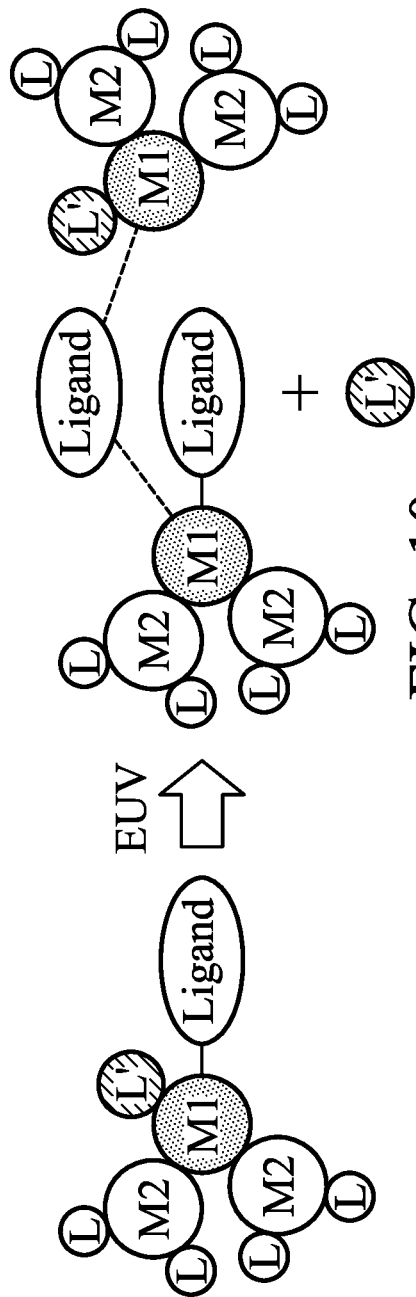
Figure 11:
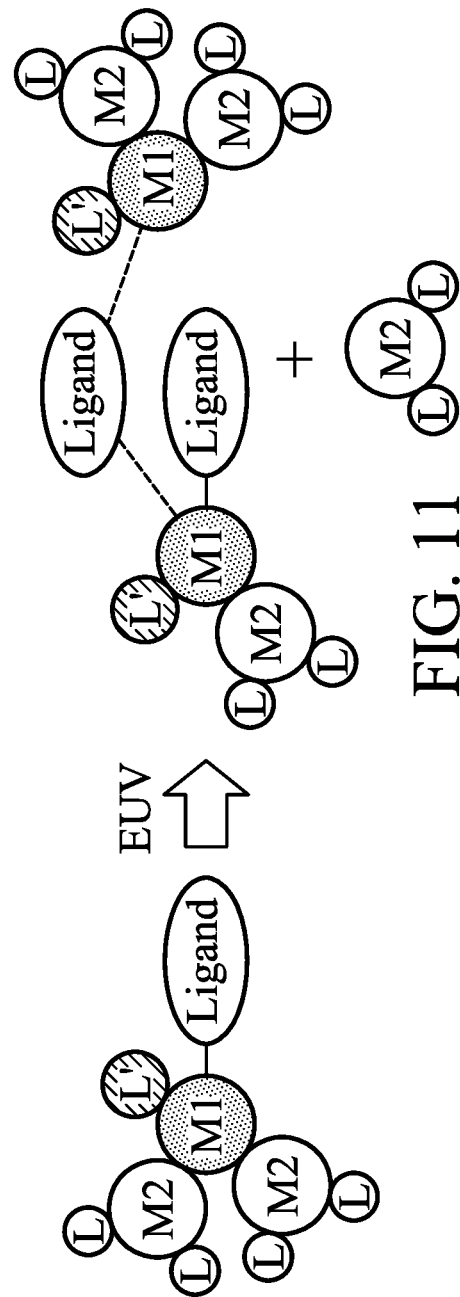
Figure 14:
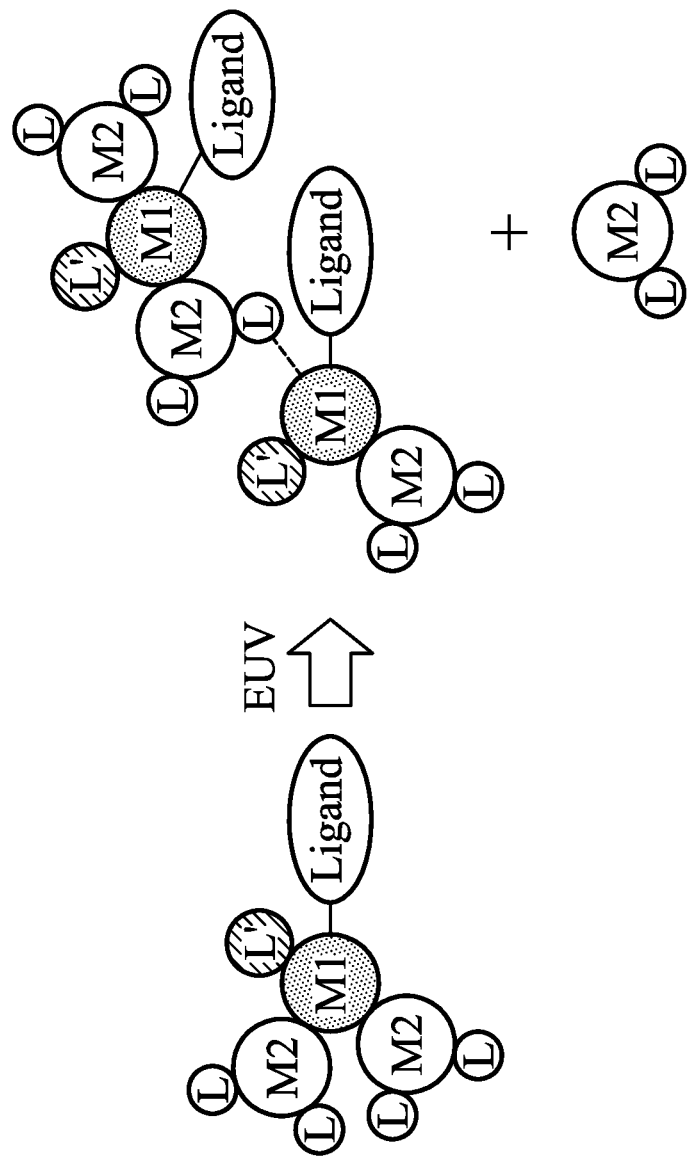
Figure 17:
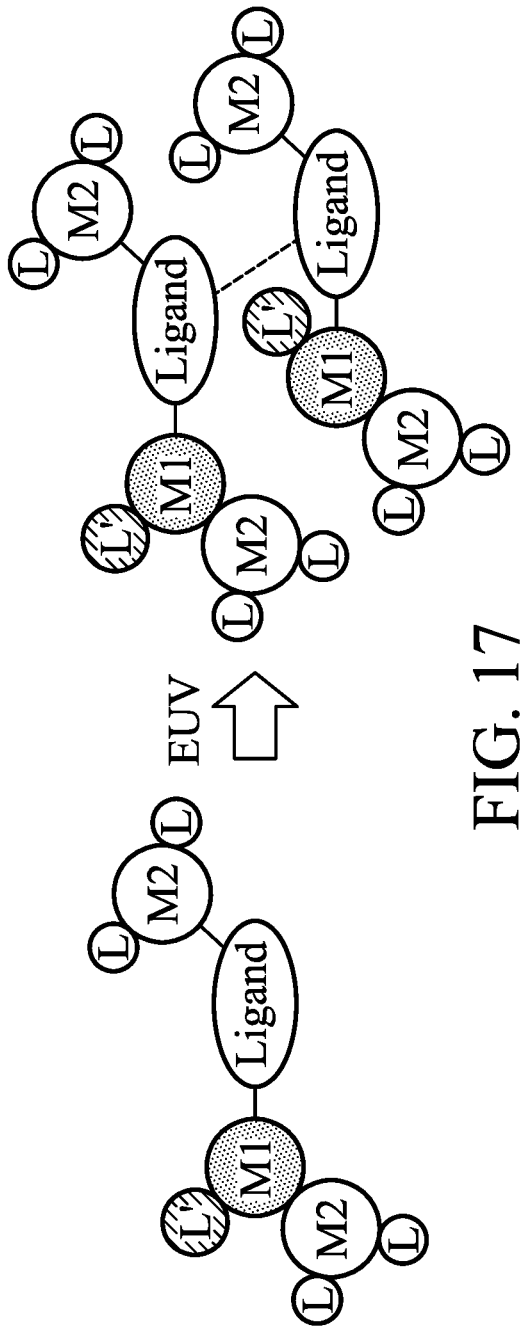
Figure 18:
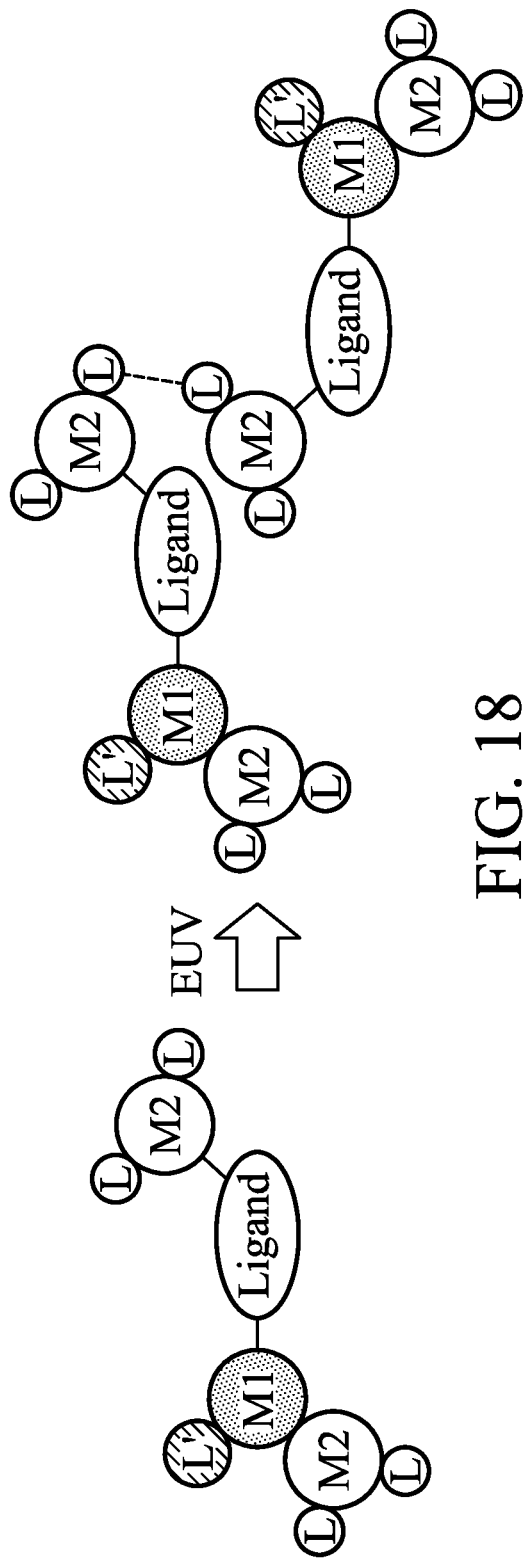
Figure 19:
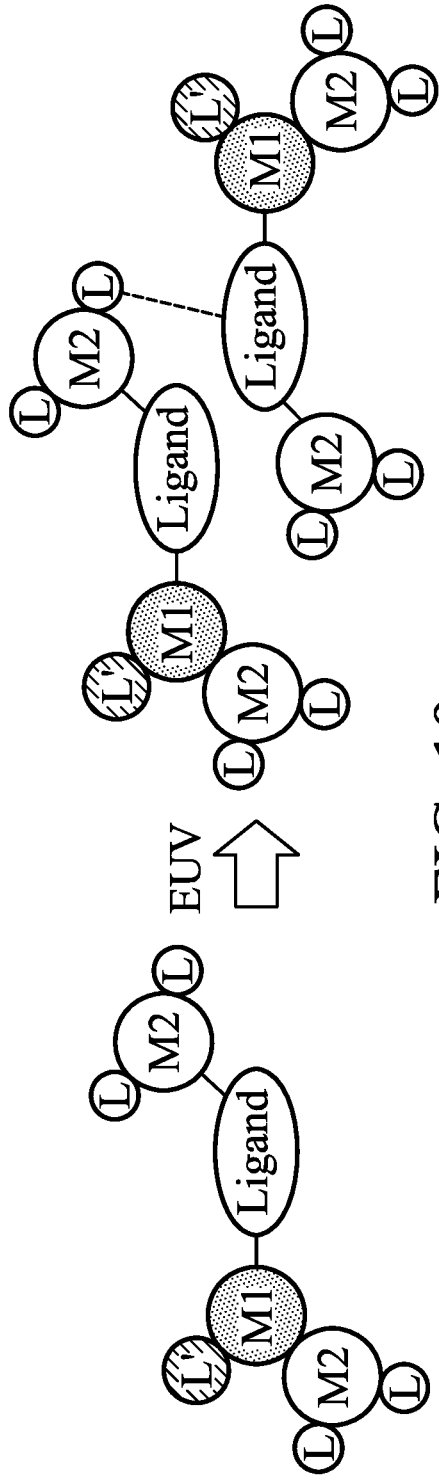
Figure 20:
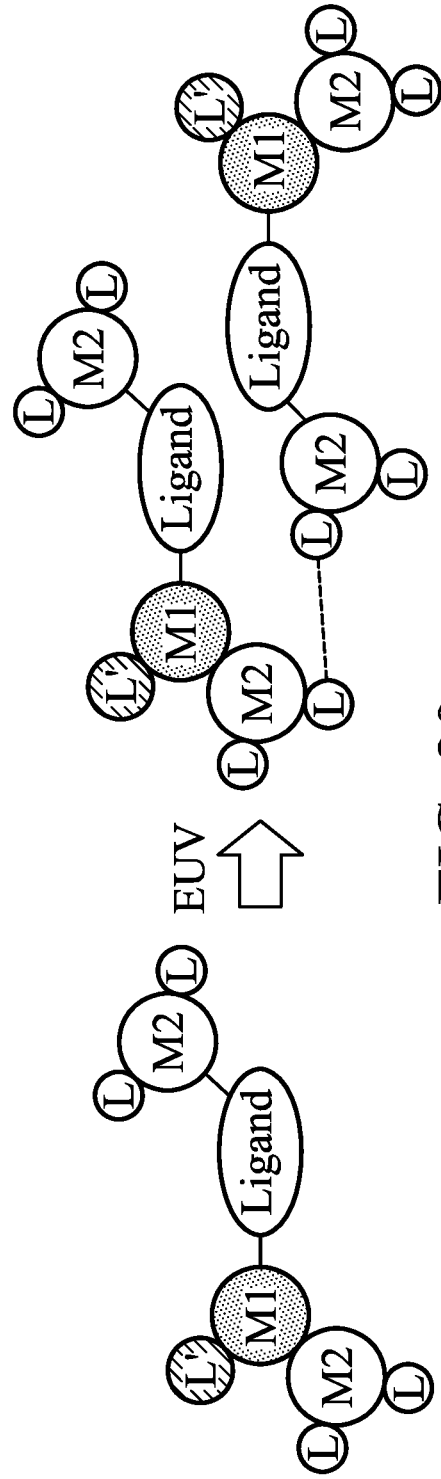
Figure 21:
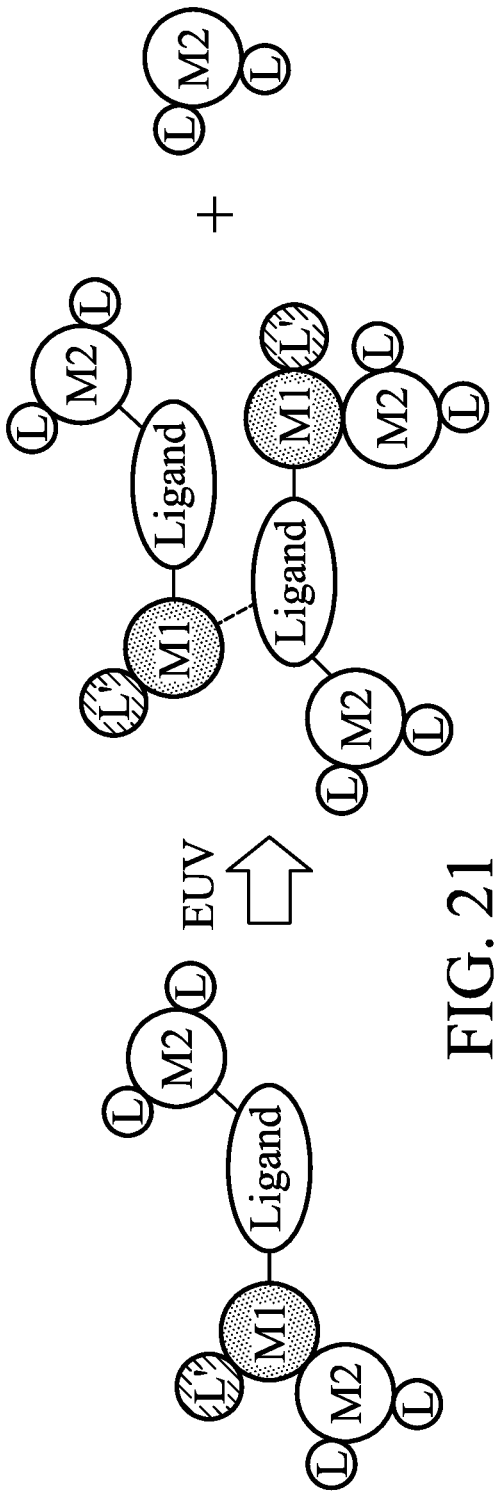
Figure 22:
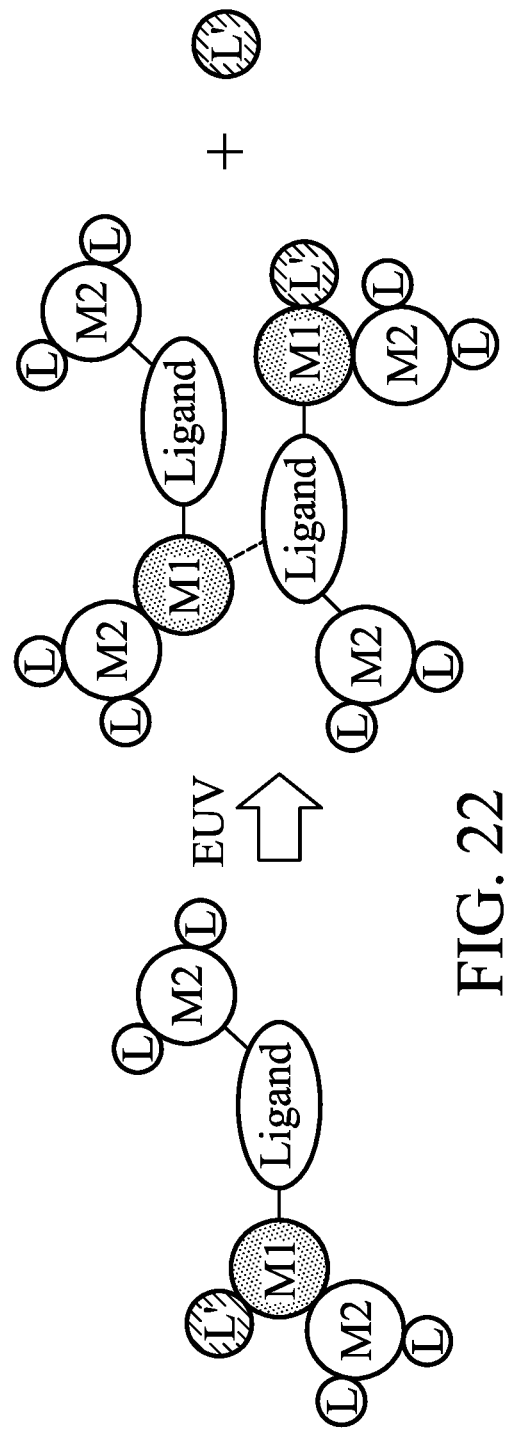
Figure 23:
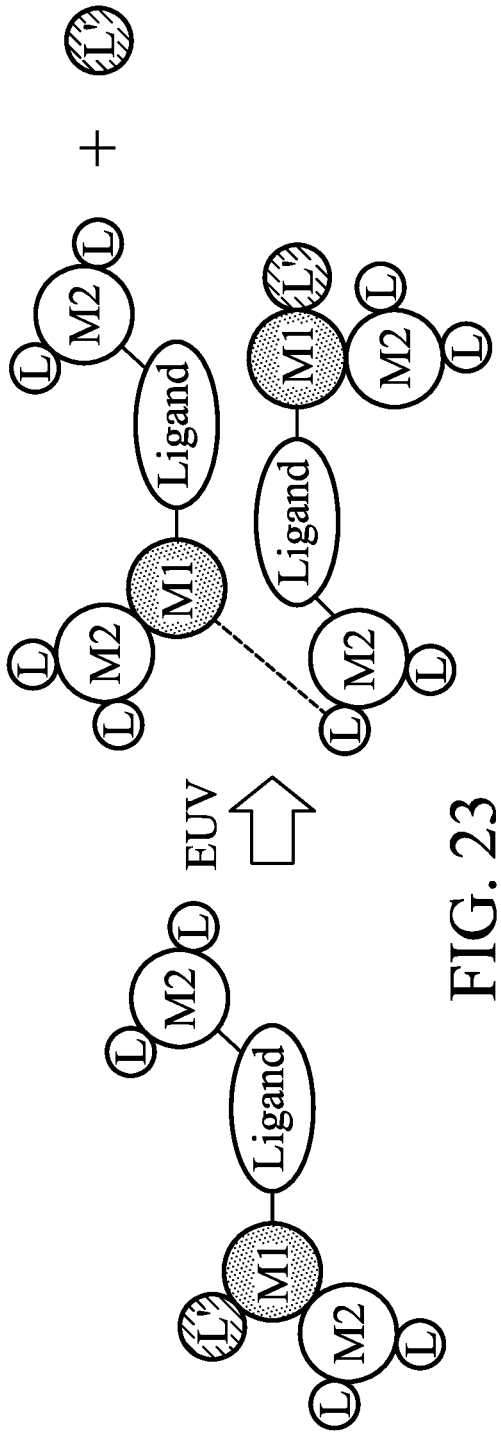
Figure 24:
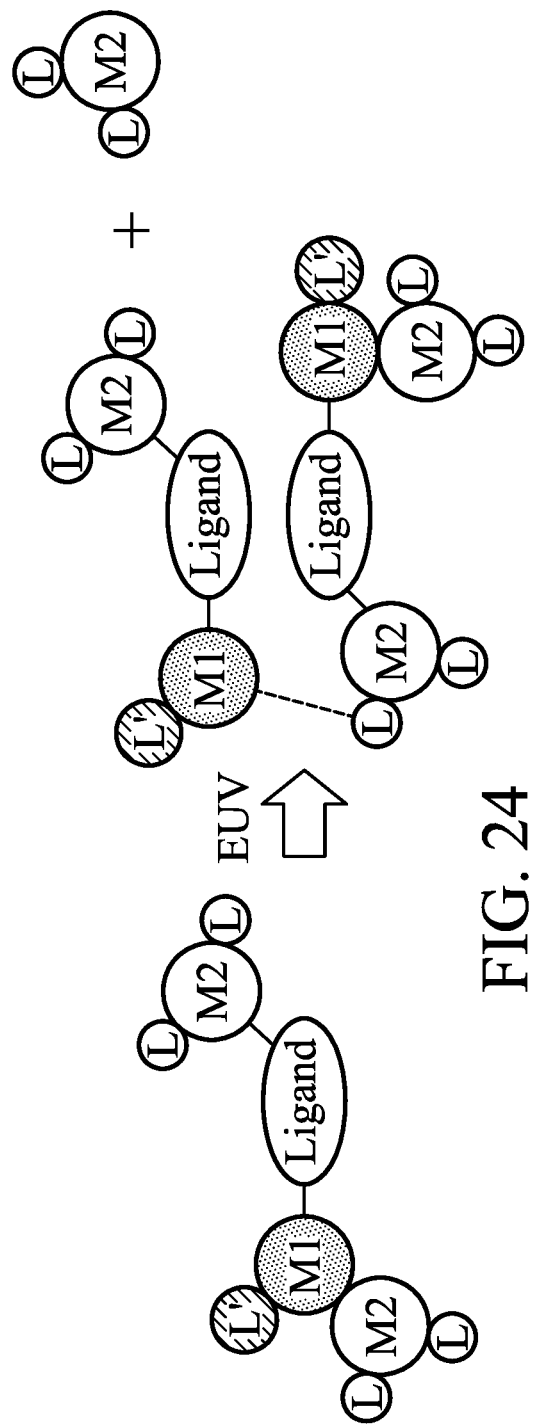
Figure 25:
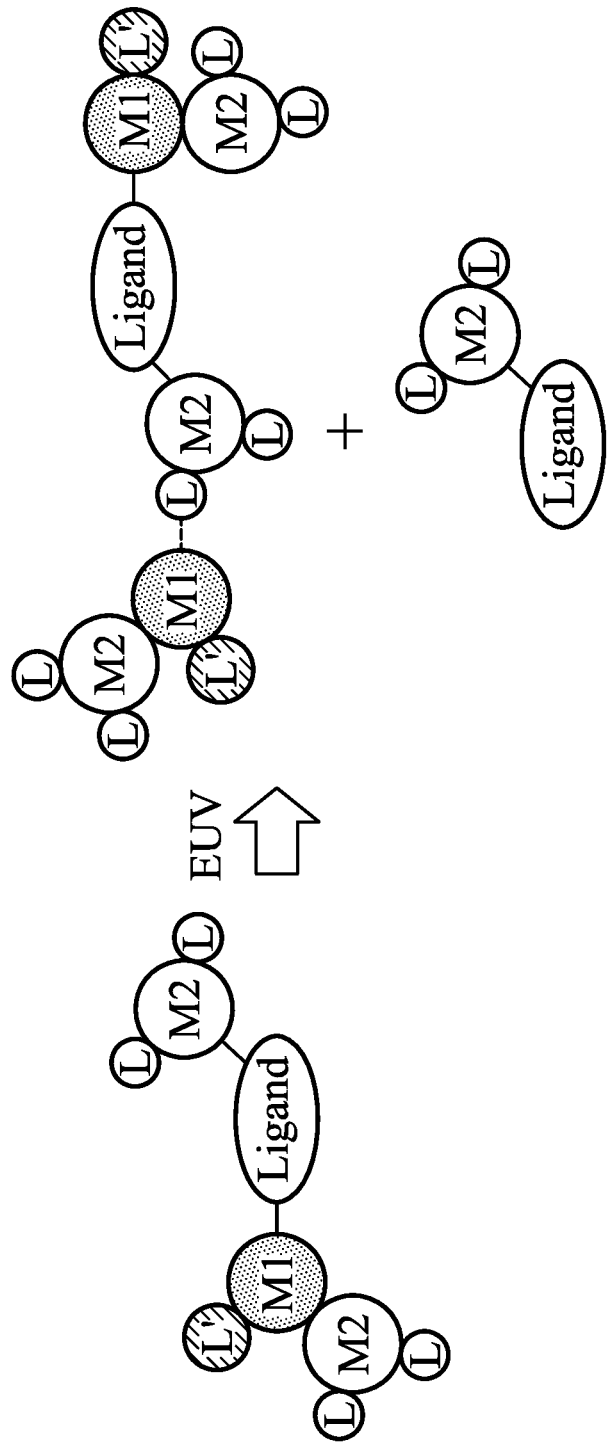
Figure 26:
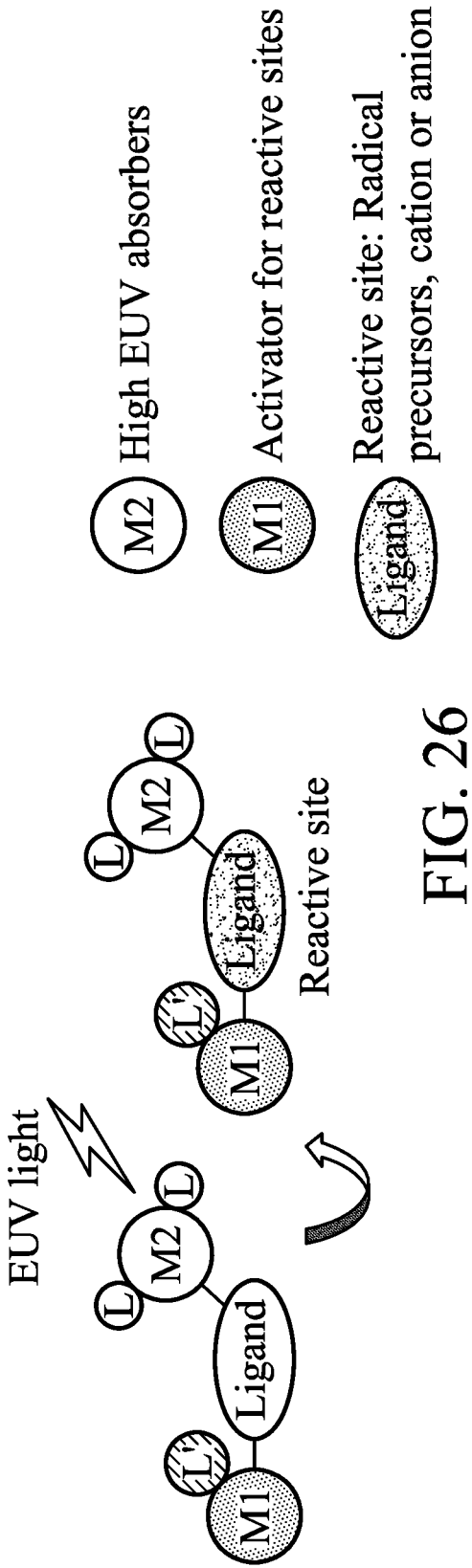
FIGS. 26-32 illustrate therein are metal and ligand functions, as well as crosslinking and replacement reactions, for a third type of multi-metal complex used for the resist layer, according to some embodiments.
Figure 27:
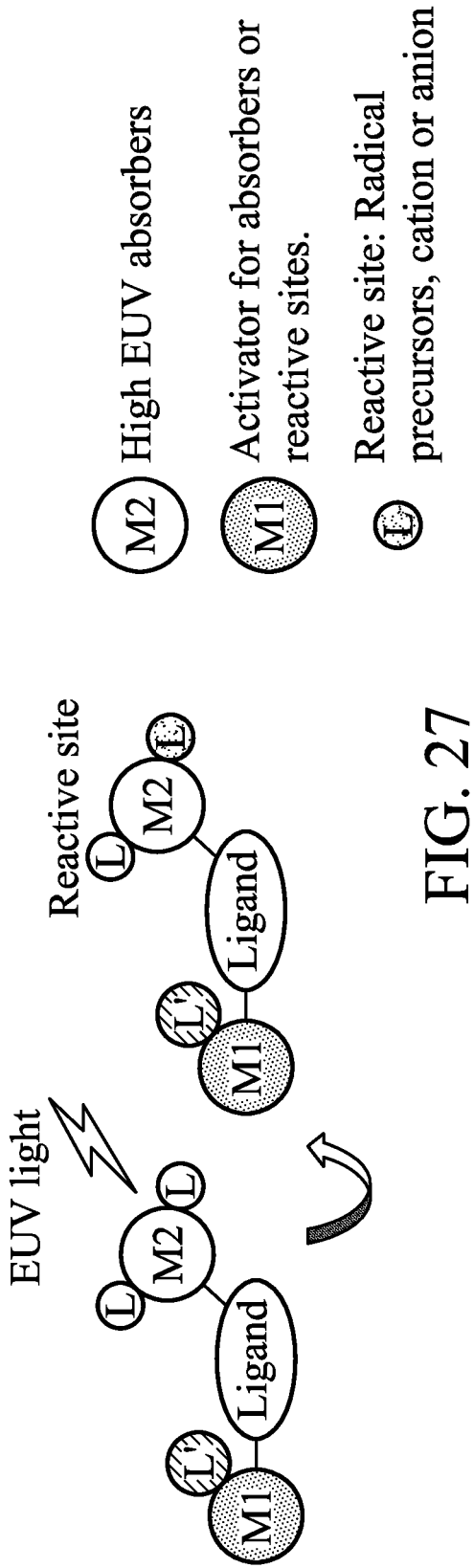
Figure 28:
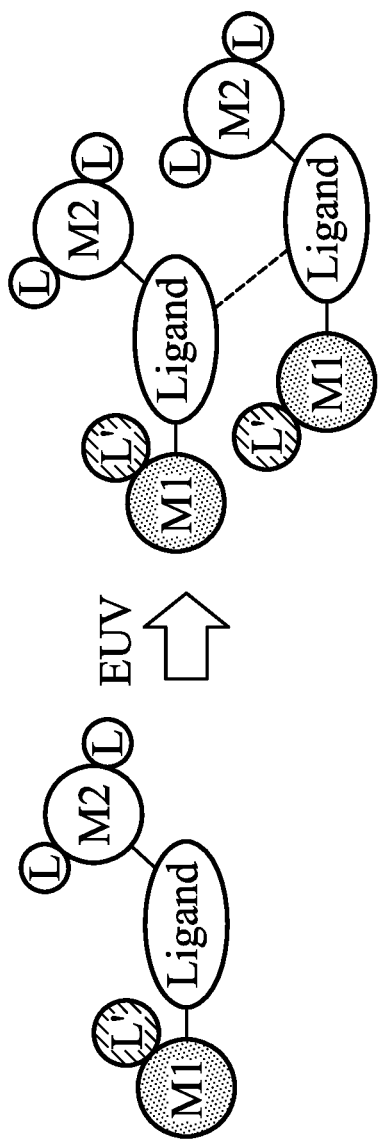
Figure 29:
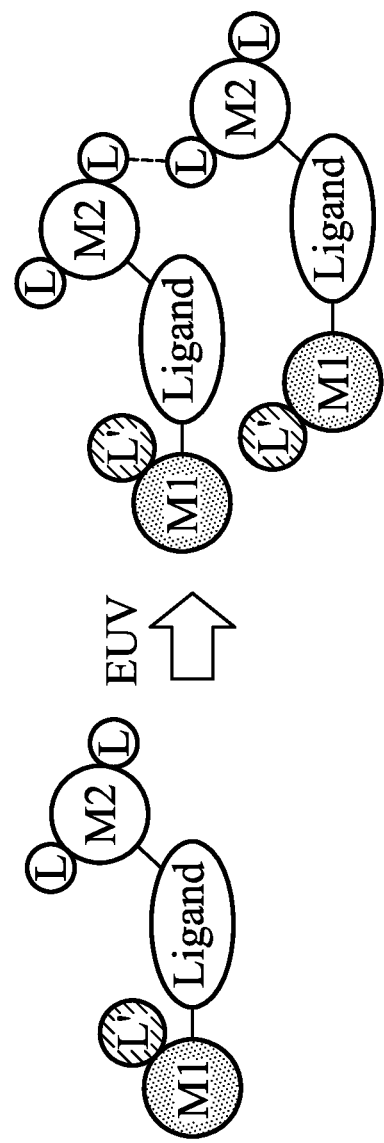
Figure 30:
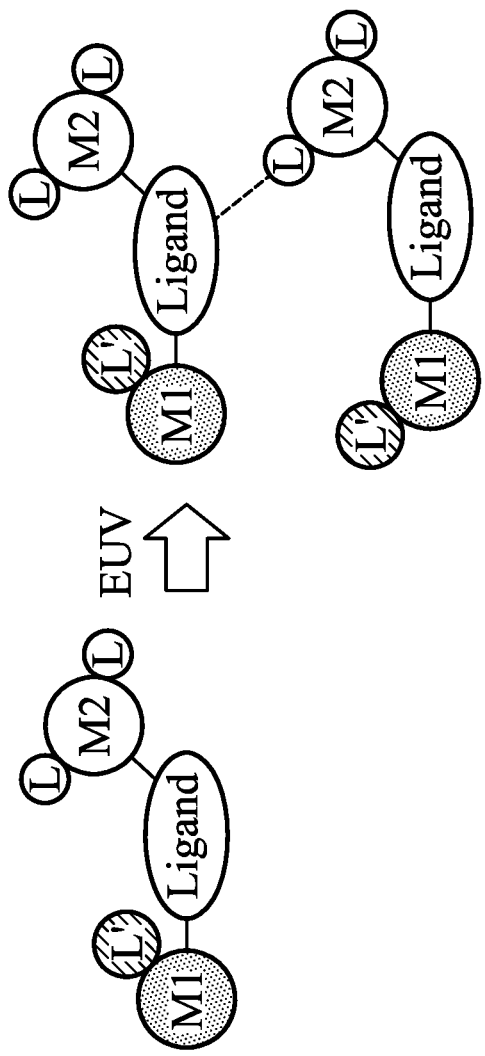
Figure 31:
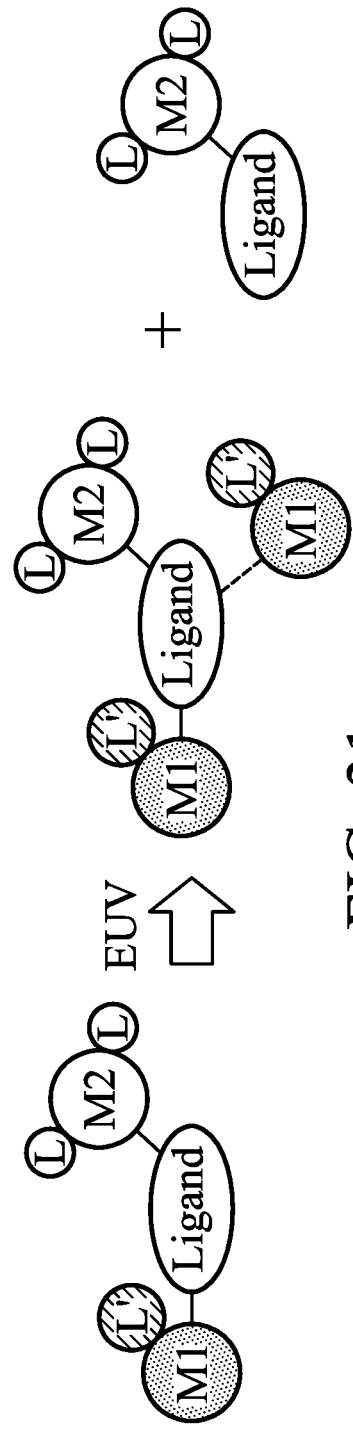
Figure 32:
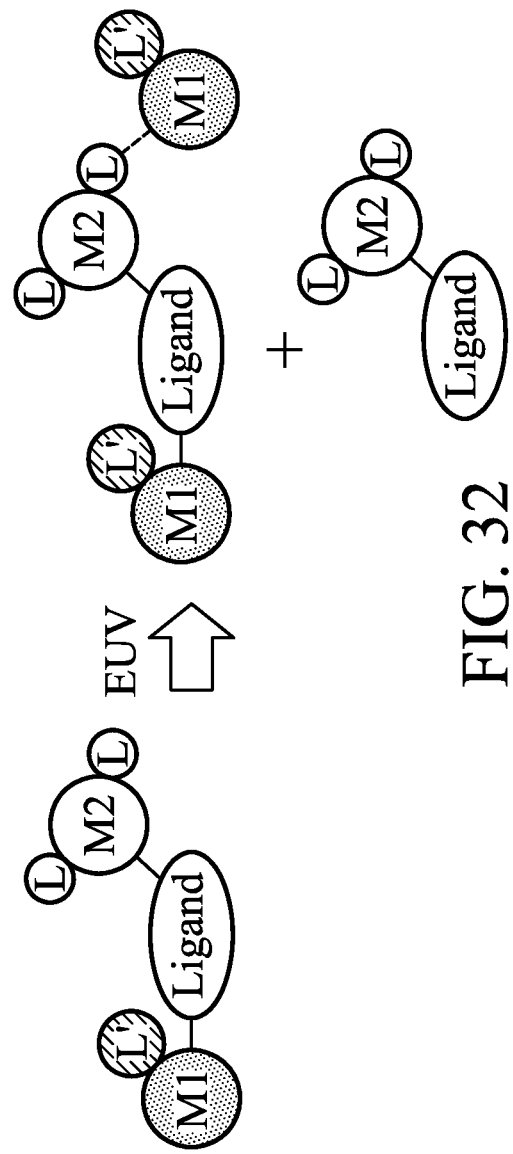
Figure 35:
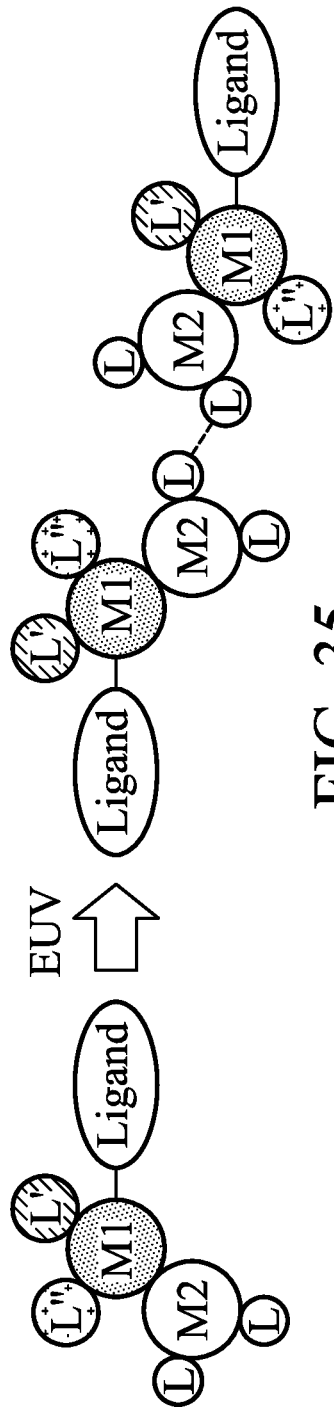
Figure 36:
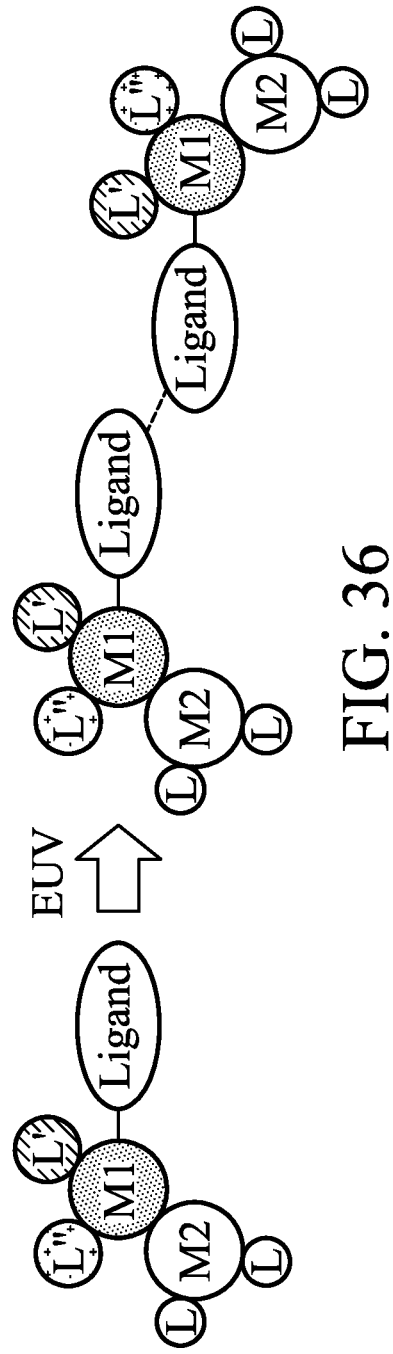
Figure 37:
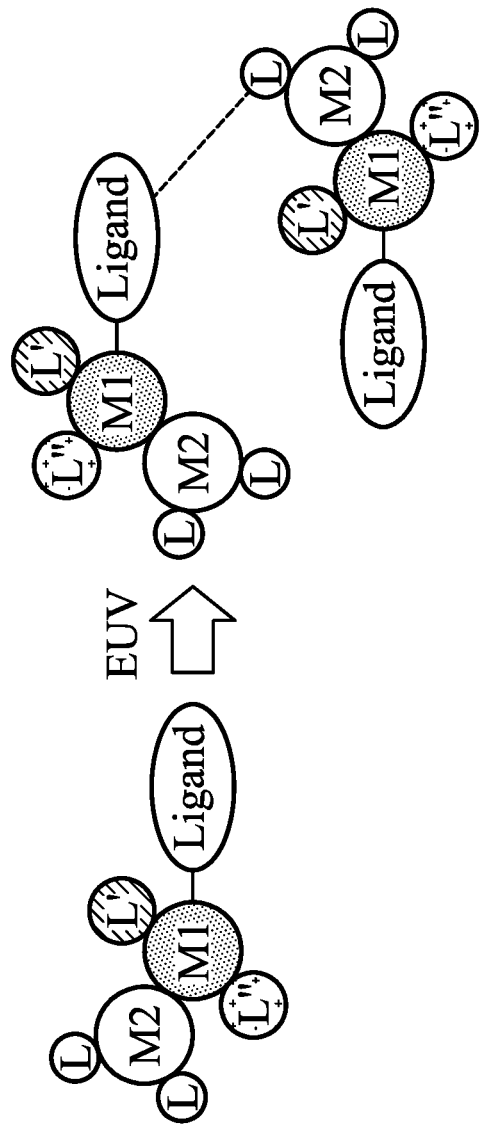
Figure 38:
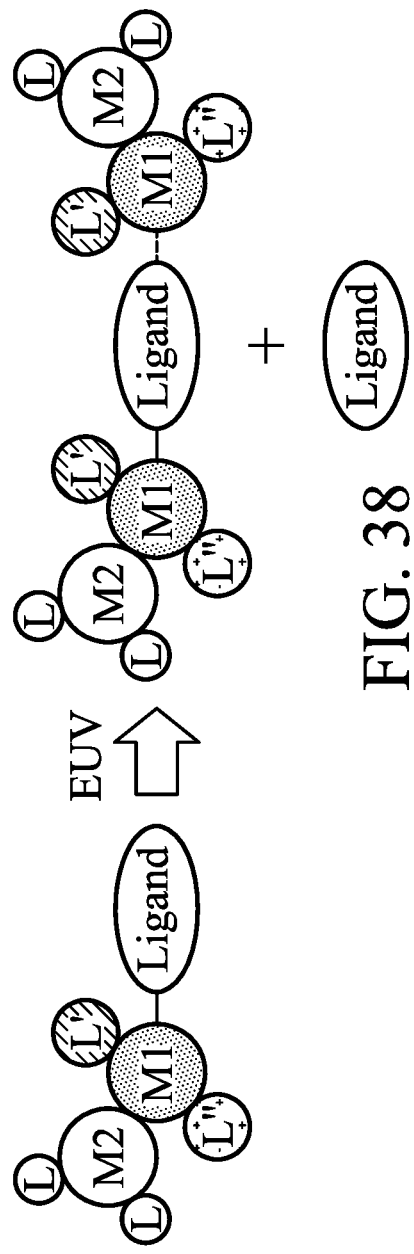
Figure 39:
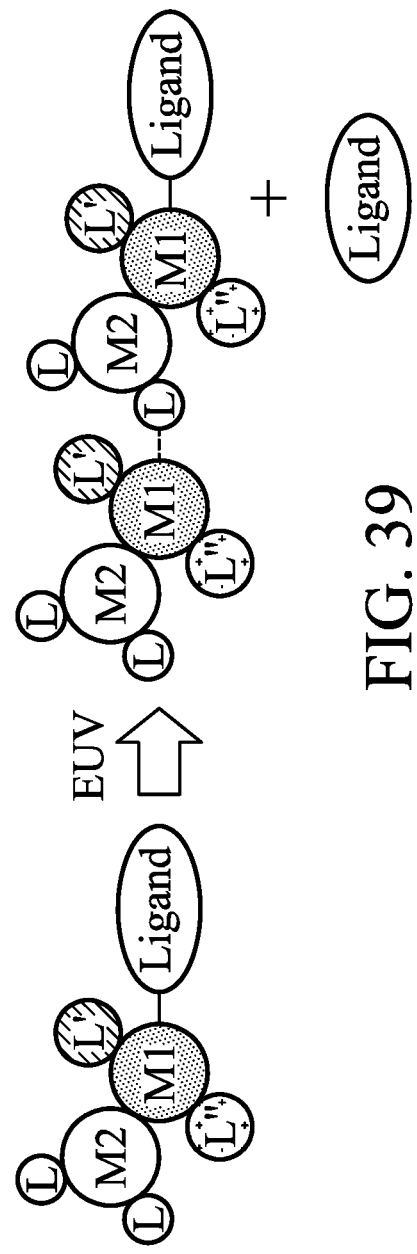
Figure 42:
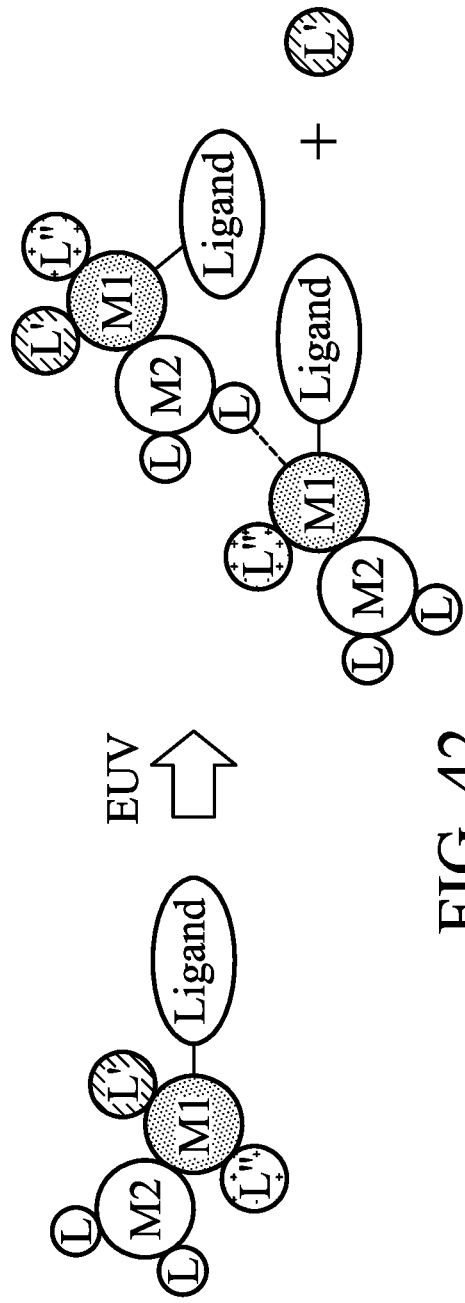
Figure 43:
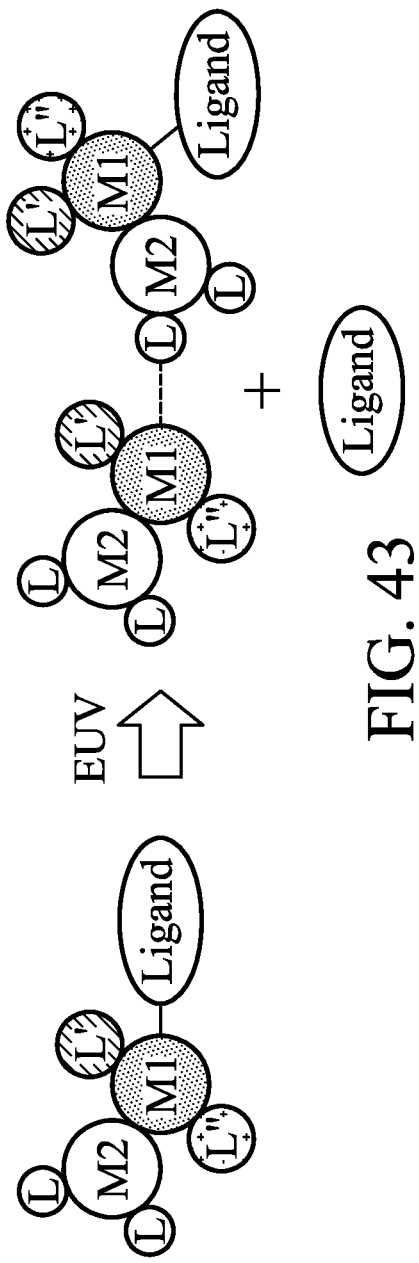
Figure 44:
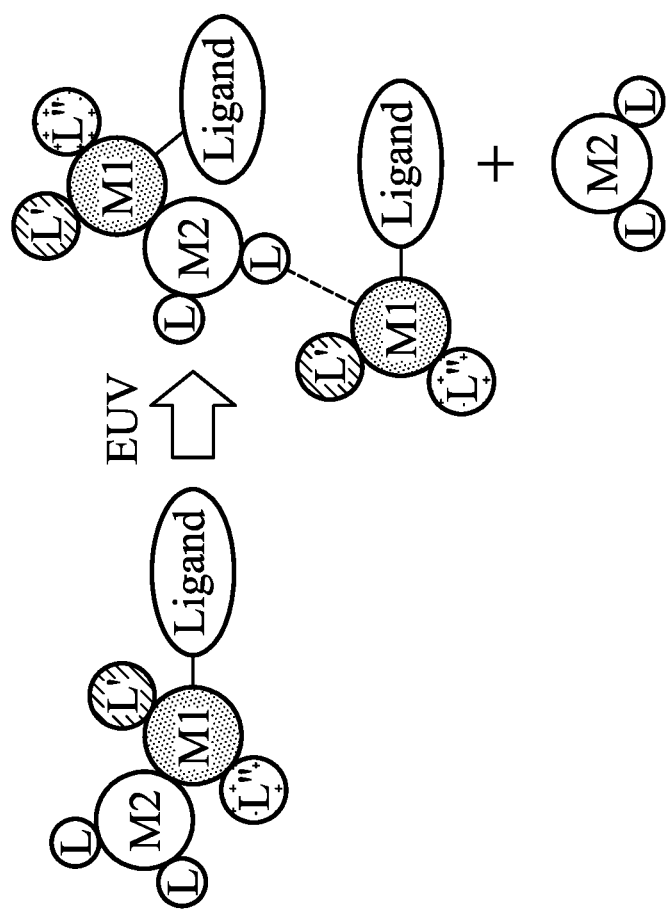
Figure 45:
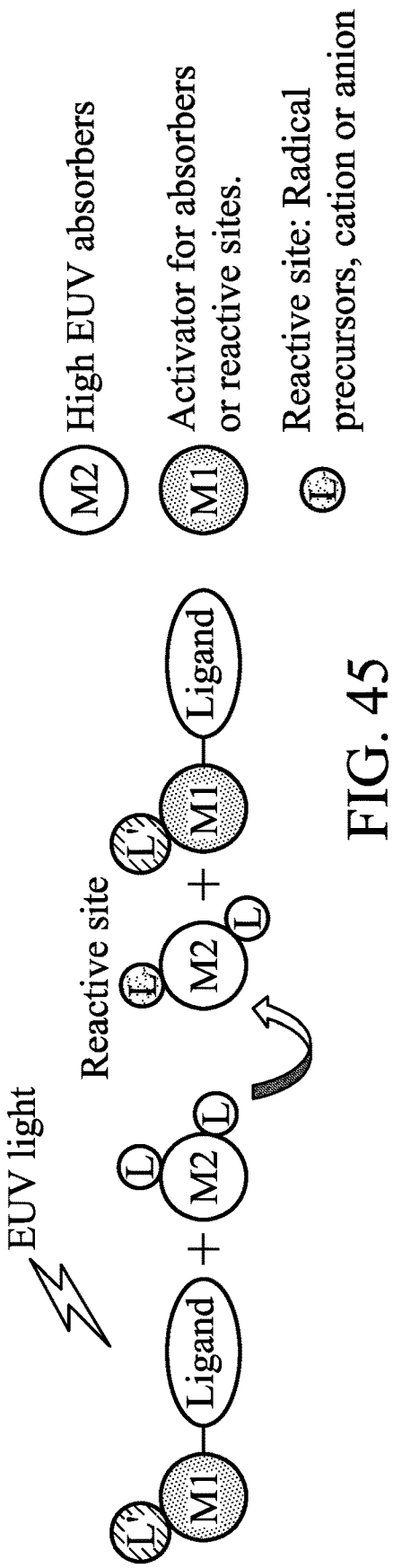
FIGS. 45-48 illustrate therein are metal and ligand functions, as well as crosslinking and replacement reactions, for a fifth type of multi-metal complex used for the resist layer, according to some embodiments.
Figure 46:
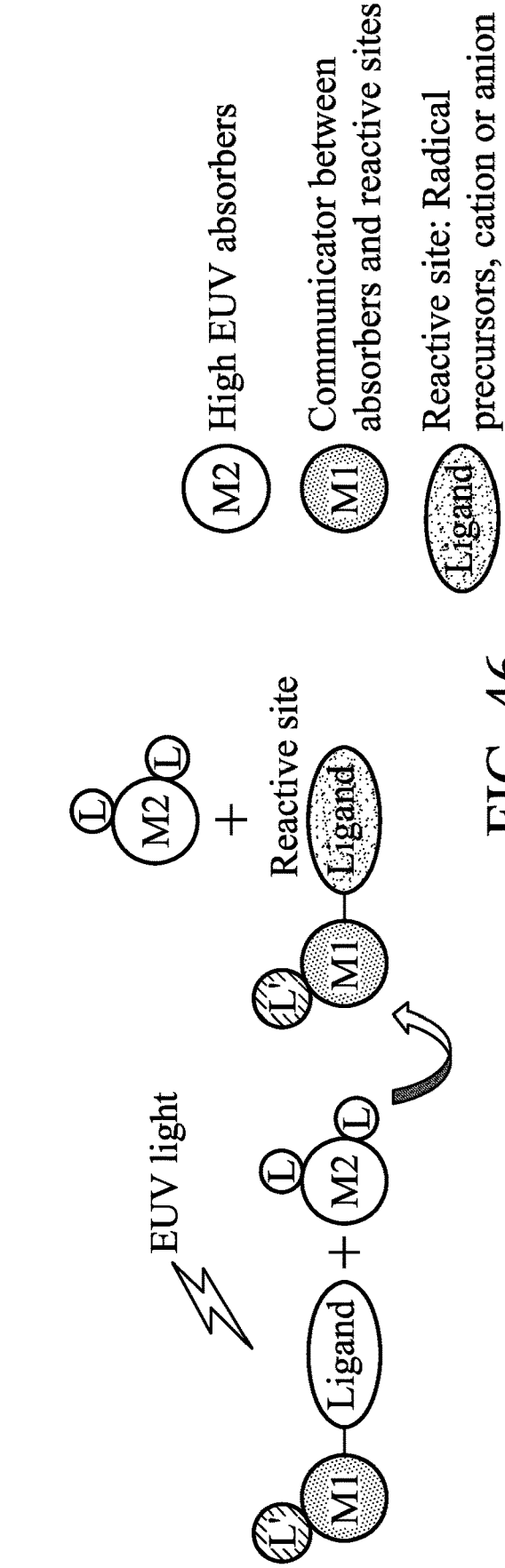
Figure 47:
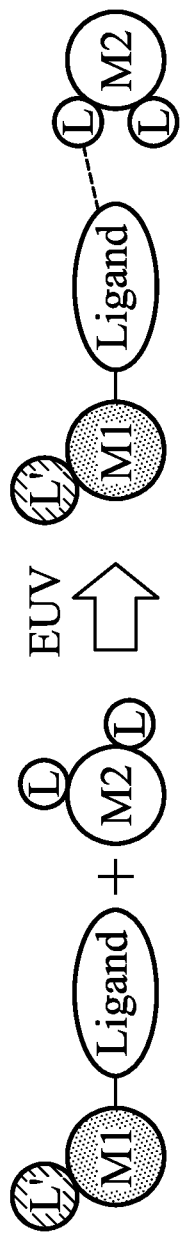
Figure 48:
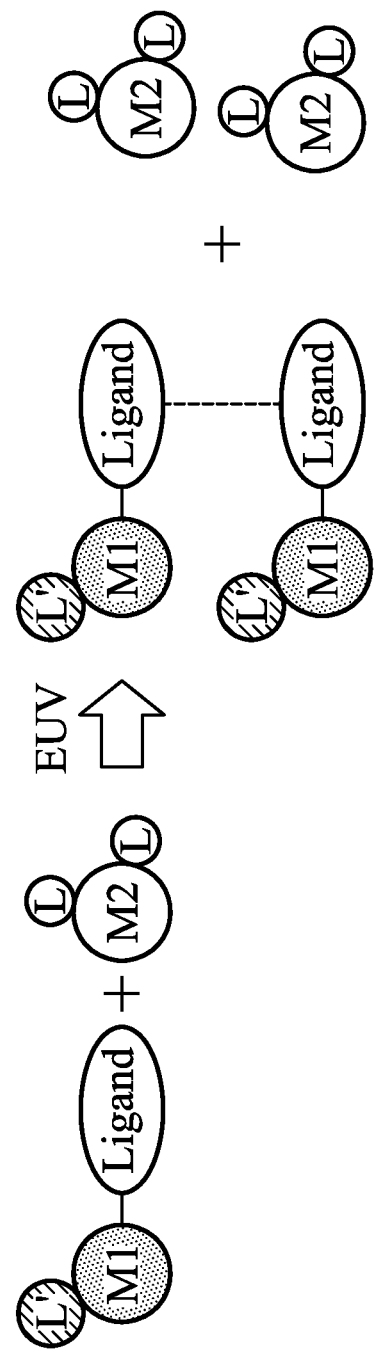
Figure 49:
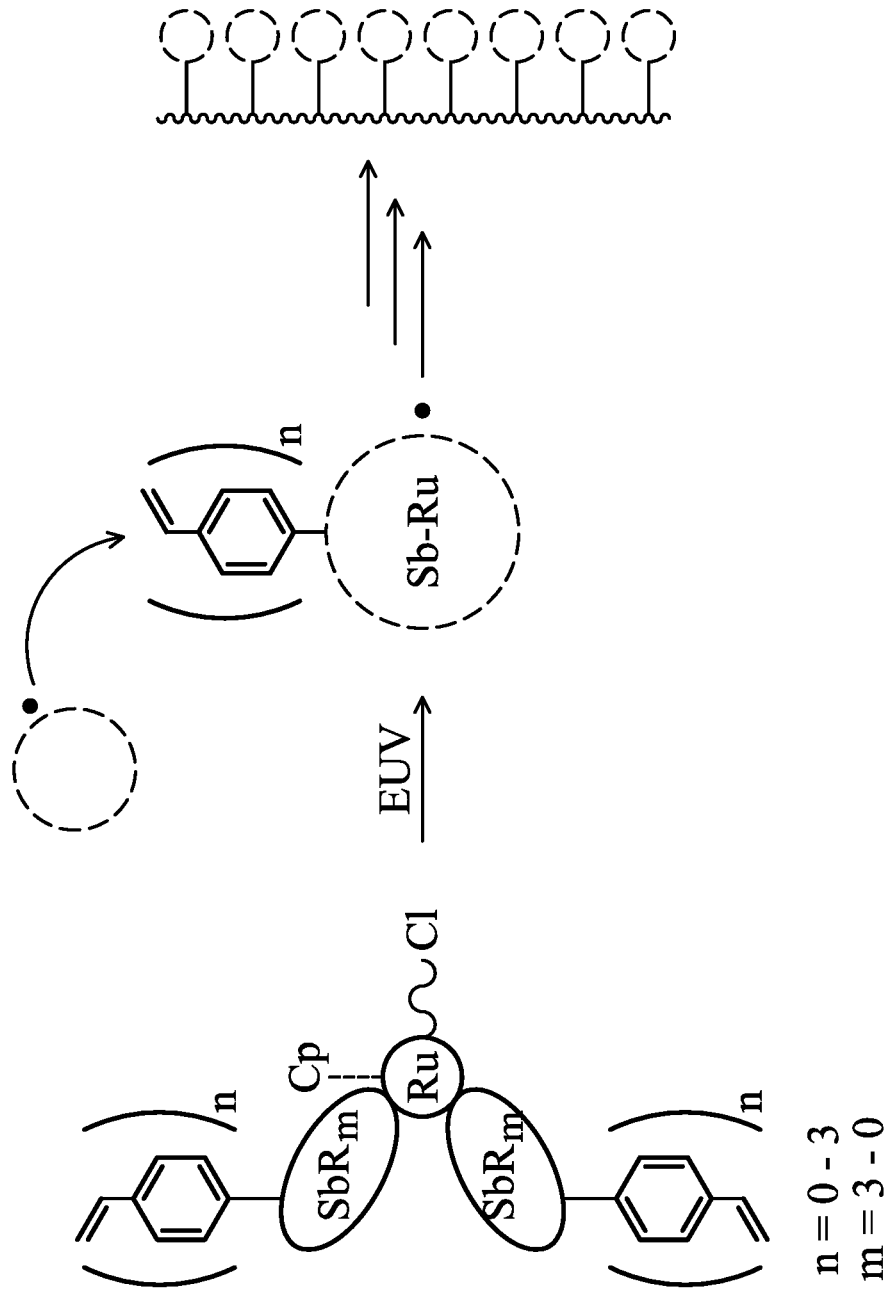
FIGS. 49-56 illustrate additional embodiments of multi-metal complexes used for the resist layer, according to some embodiments.
Figure 50:
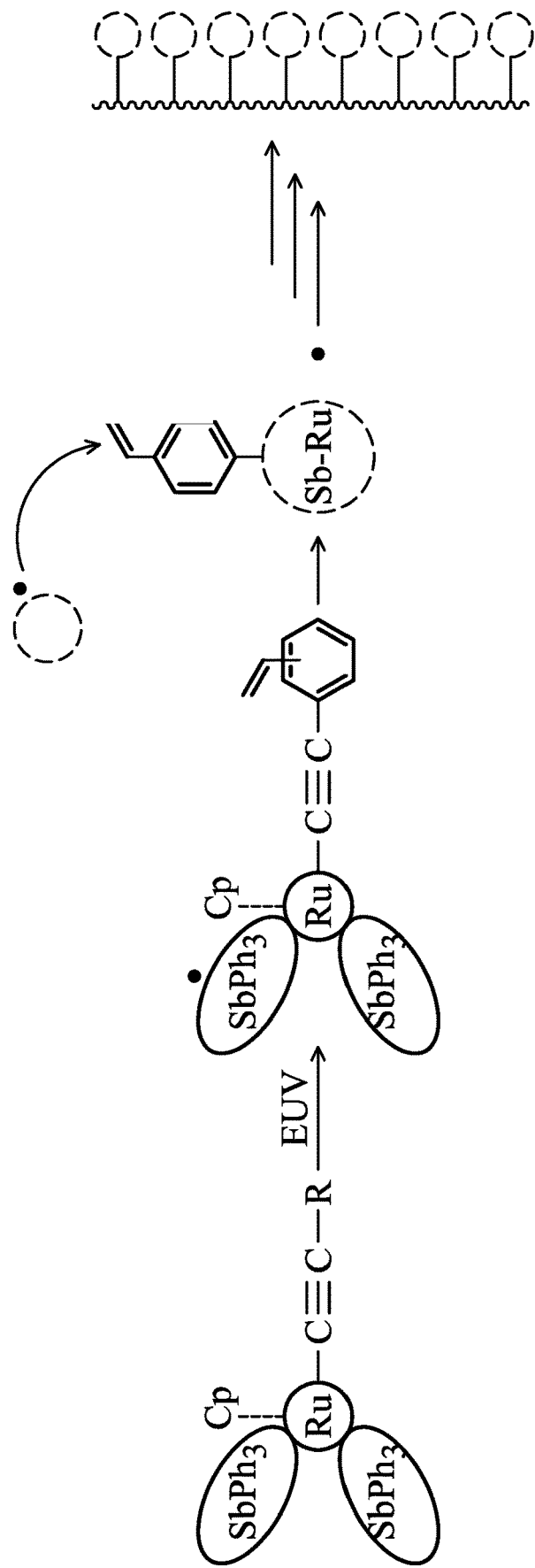
Figure 51:
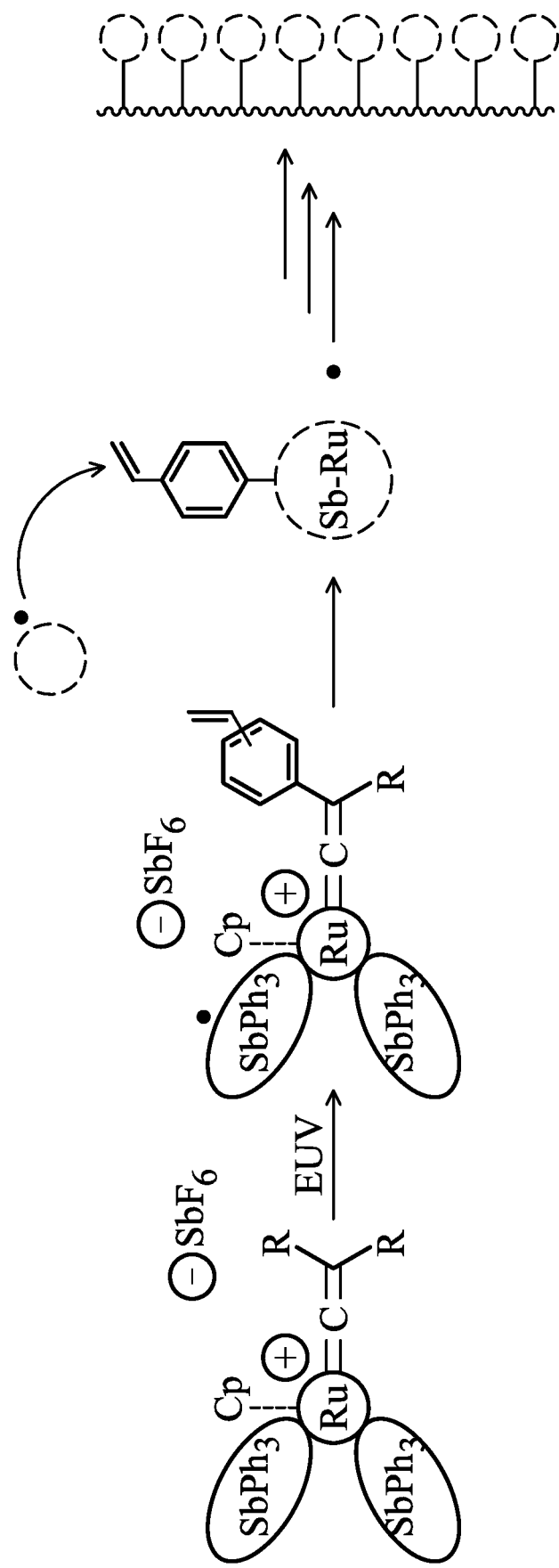
Figure 52:
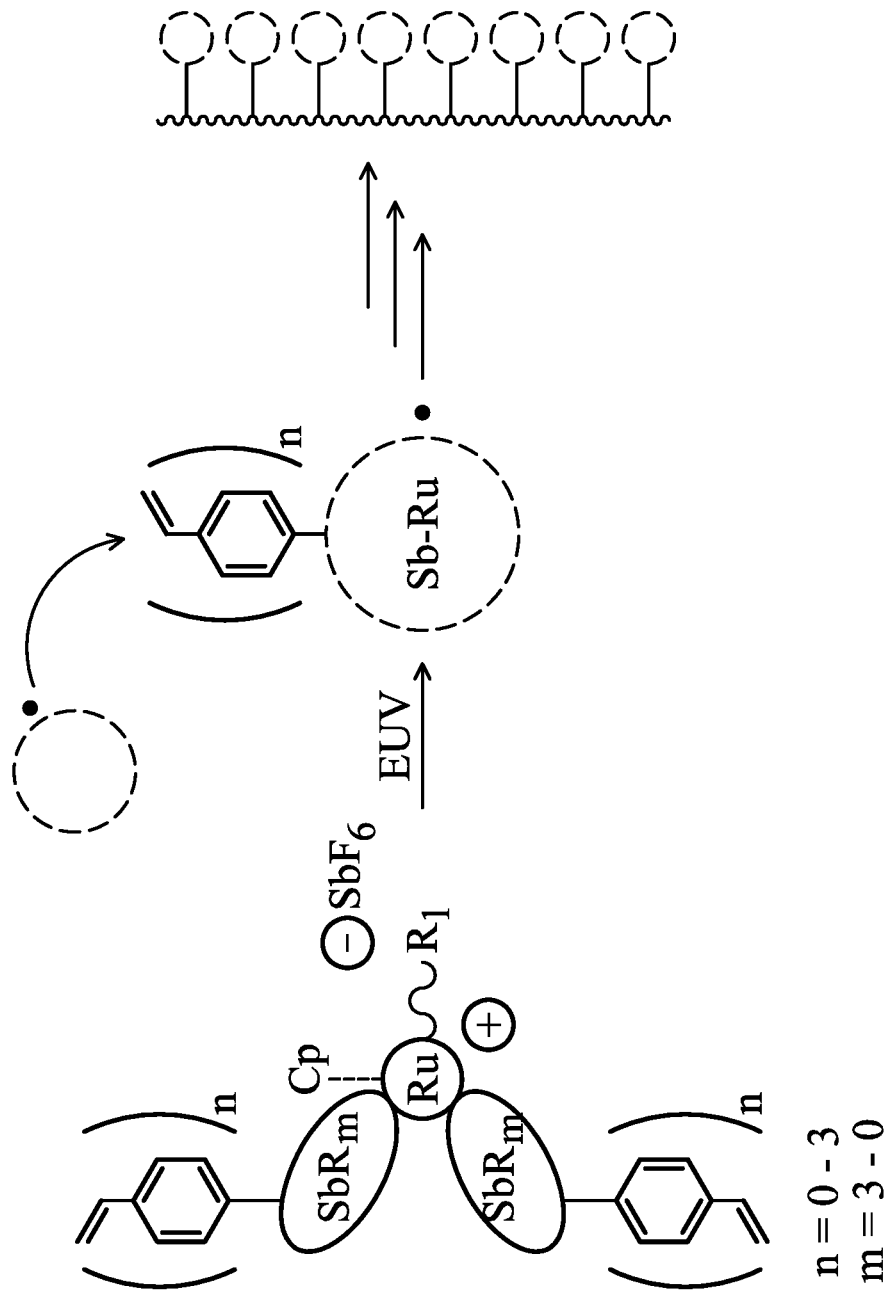
Figure 53:
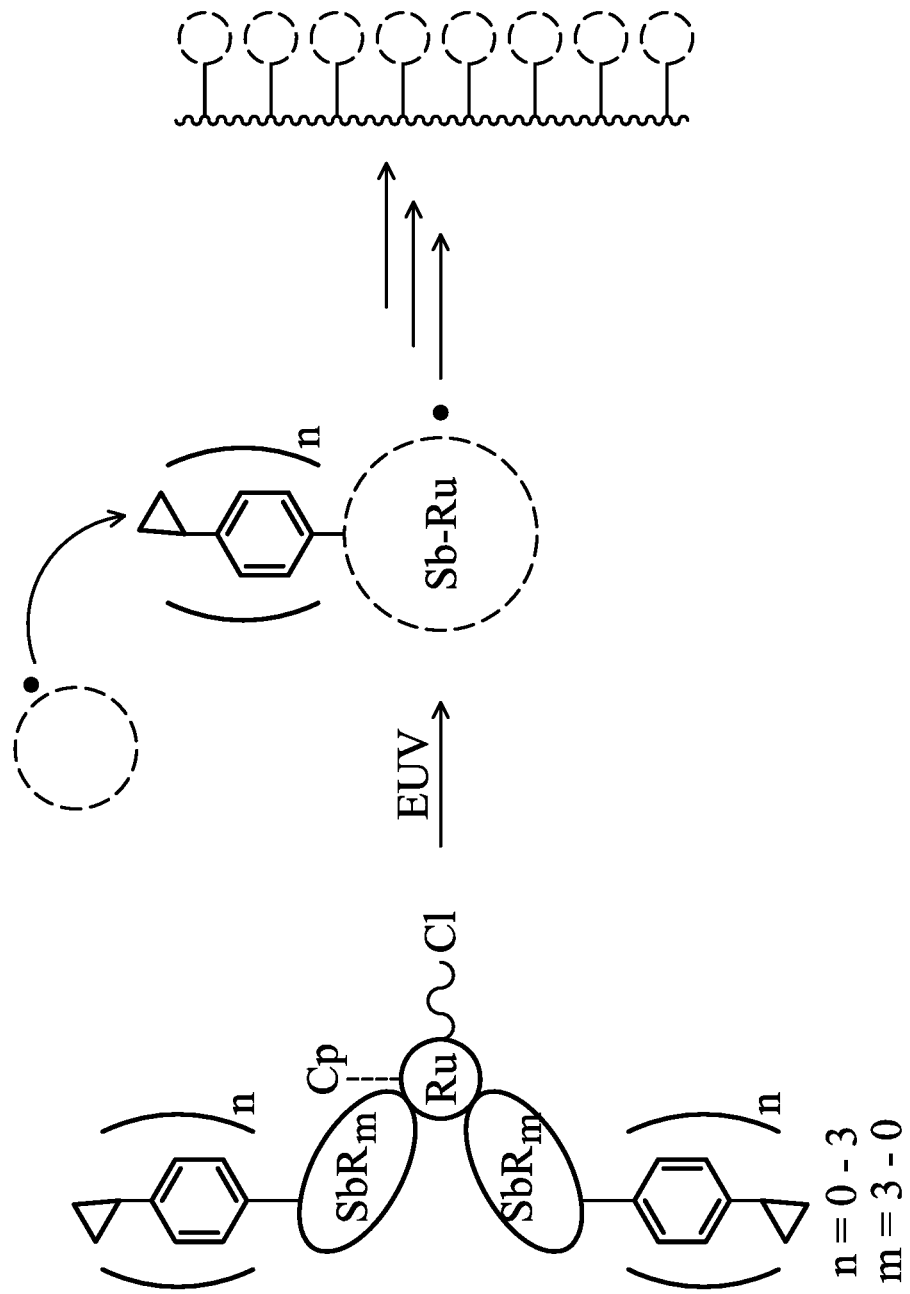
Figure 54:
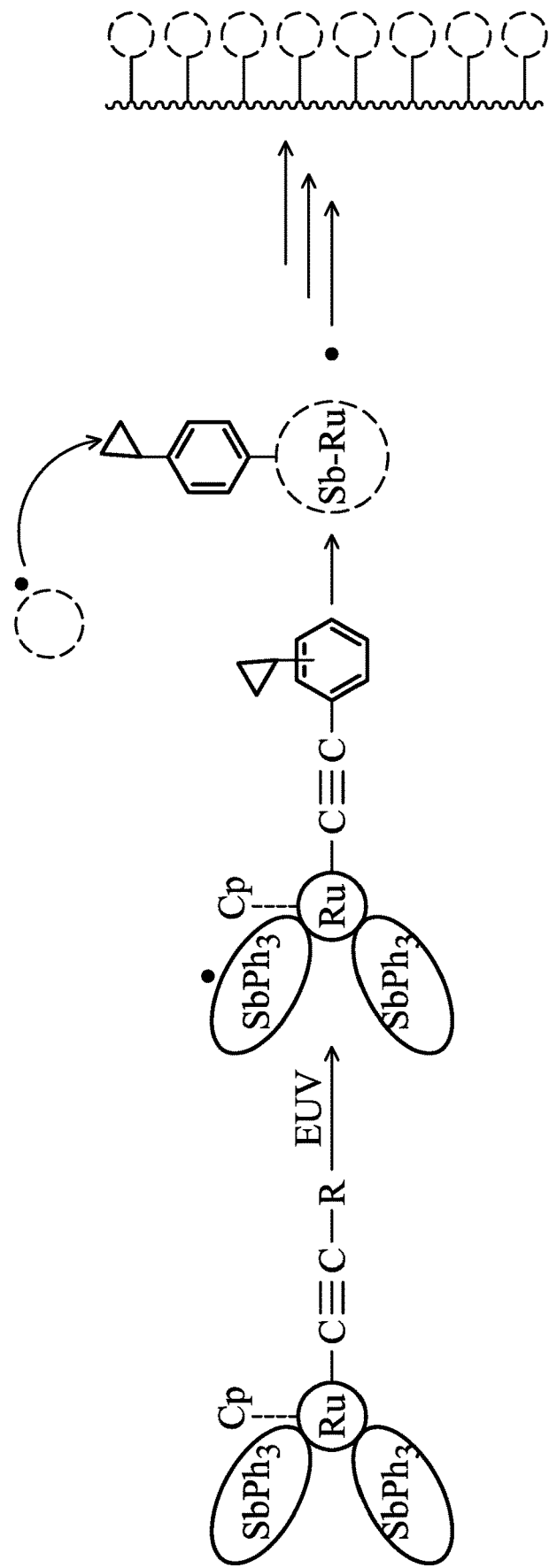
Figure 55:
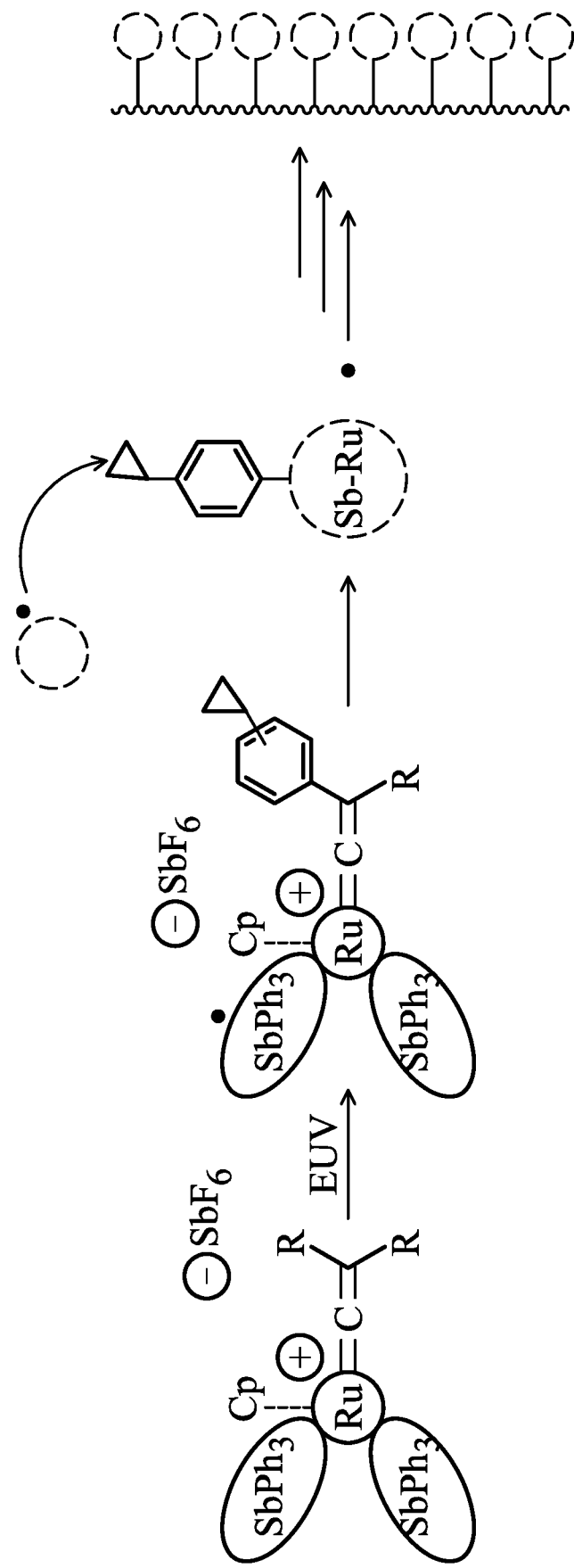

It is also noted that the different first, second, third, fourth, and fifth types of multi-metal complexes illustrated in FIGS. 3-48 may be formed as a result of different methods of synthesizing the multi-metal complexes. Moreover, each of the five types of multi-metal complexes shown still includes the bridging element (e.g., first metal) and an EUV absorption element (e.g., second metal), as described above. Additionally, in the various embodiments shown and described herein, secondary electrons may be generated (e.g., by EUV absorption), where such secondary electrons may be transferred (e.g., through chemical bonds and/or space) and interact with ligands to further help activate ligands for subsequent participation in a cross-linking reaction. In the examples illustrated in FIGS. 3-48, at least some of the ligands (e.g., those labeled as L' and L") may be very stable ligands and thus may be quite difficult to activate, and thus such ligands may not directly participate in cross-linking reactions. By way of example, it is also noted that the replacement reactions (e.g., as shown in FIG. 8 and others) may include the replacement of a first ligand by a second ligand, where for example, the second ligand includes an activated ligand suitable for participation in a subsequent cross-linking reaction. It is further noted that the discussion and examples provided above may be equally applicable to the variety of multi-metal complex types illustrated in FIGS. 3-48, as well as the multi-metal complexes of FIGS. 49-56.

Referring now to FIGS. 49-56, illustrated therein are additional embodiments of multi-metal complexes used for the resist layer 206. In some cases, the examples shown in FIGS. 49-56 may include various embodiments of the examples of FIGS. 3-48. As similarly noted above, while the reactions illustrated in the examples of FIGS. 49-56 are shown as being catalyzed by EUV radiation, in some cases the reactions may respond to other types of radiation such as DUV, e-beam, X-ray, ion beam, or other type of radiation. As previously described, embodiments of the present disclosure may include non-CAR multi-metallic EUV resists. In some resist embodiments, Ru is used as a center to bond with two high EUV absorption metal Sb through coordinate chemical bonds. In some cases, styrene will be attached to Sb or Ru for cross-linking reaction. In some embodiments, additional styrene makes the cross-linking reaction more efficient. In some cases, an Sb anion may be used to increase EUV absorption through cationic ruthenium vinylidene complexes containing the cyclopentadienyl and $Sb(R)_3$ ligand. FIGS. 49-56, in particular, illustrate Ru- and Sb-containing resist complexes, in accordance with various embodiments. Moreover, FIGS. 49-56 illustrate exemplary reactions (e.g., which may include a reaction of alkenes, cyclopropanes, etc.), and where second electrons generated by EUV absorption may transfer through chemical bonds and space.

Additional details of the various resist compositions and multi-metal complexes used for the resist layer 206, as well as additional details of other aspects of various methods and structures (e.g., materials of the structure 200) that may be fabricated in accordance with embodiments of the present disclosure, are now discussed.

For example, some embodiments of the present disclosure provide a method of forming a semiconductor pattern, where the method includes forming a first material layer on a semiconductor substrate, forming a second material layer on top of the first material layer (e.g., where the second material layer is a silicon hardmask), forming a third material layer on top of the second material layer (e.g., where the third material layer is a photoresist), and forming a photoresist pattern by a photolithography process. In some examples, the photoresist pattern may be used as an etch mask in a subsequent etching processes, for example to transfer the pattern of the patterned resist layer to an underlying material layer (e.g., to form the semiconductor pattern). Alternatively, the resist pattern may be used as an ion implantation mask in a subsequent ion implantation process applied to the underlying material layer. In some embodiments, the first material layer has a different optical property compared to the silicon hardmask and the photoresist. In some cases, the first material layer has a substantially different n, k or T value compared to the photoresist. In various embodiments, the first material layer includes at least one of a different polymer structure, acid-labile molecule, photoacid generator (PAG) loading, quencher loading, chromophore, cross linker, or solvent, which leads to a different n value compared to the photoresist. In some embodiments, the first material layer, the second material layer (e.g., the silicon hardmask), and the photoresist have different etch resistances. In some cases, the first material layer or the photoresist contain at least one etching resistance molecule. By way of example, the etching resistance molecule may include a low onishi number structure, a double bond, a triple bond, silicon, silicon nitride, Ti, TiN, Al, aluminum oxide, or SiON, among others. In some embodiments, the semiconductor substrate is substantially conductive or semiconductive with the electric resistance less than $10^3$ ohm-meter. In some examples, the semiconductor substrate may include a metal, a metal alloy, and/or metal nitride/sulfide/selenide/oxide/silicide with the formula $MX_a$, where M is a metal and X is N, S, Se, O, or Si with a=0.4~2.5. For example, Ti, Al, Co, Ru, TiN, WN2, TaN. In some embodiments, the semiconductor substrate includes a dielectric having a dielectric constant in a range from about 1 to 40. In various embodiments, the semiconductor substrate may include Si, a metal oxide and a metal nitride, in accordance with the formula is $MX_b$, where M is a metal or Si, and X is N or O with b=0.4~2.5. For example, $SiO_2$, silicon nitride, aluminum oxide, hafnium oxide, lanthanum oxide.

Additionally, in some examples, embodiments of the present disclosure provide a method of forming a semiconductor pattern, where the method includes forming a first material layer on a semiconductor substrate, forming a second material layer on top of the first material layer (e.g., where the second material layer is a silicon hardmask), forming a third material layer on top of the second material layer (e.g., where the third material layer is a photoresist), and forming a photoresist pattern by photolithography. In some examples, the photoresist pattern may be used as an etch mask in a subsequent etching processes, for example to transfer the pattern of the patterned resist layer to an underlying material layer (e.g., to form the semiconductor pattern). Alternatively, the resist pattern may be used as an ion implantation mask in a subsequent ion implantation process applied to the underlying material layer. In some examples, the second material layer may include a silicon-containing polymer, a crosslinker, a chromophore, a PAG, a quencher (base), a fluoro additive, and/or a solvent. In some embodiments, the second material layer may have a different optical property compared to the first material layer and the photoresist. In some cases, the second material layer has a substantially different n, k or T value compared to the first material layer and the photoresist. In various embodiments, the second material layer may include at least one of a different silicon-containing polymer structure, an acid-labile molecule, PAG loading, quencher loading, a chromophore, a cross linker, and/or a solvent, which may lead to a different n value compared to the photoresist. In some embodiments, the first material layer, the second material layer (e.g., the silicon hardmask), and the photoresist have different etch resistances. In some cases, the second layer includes at least one etching resistance molecule. By way of example, the etching resistance molecule may include a low onishi number structure, a double bond, a triple bond, silicon, silicon nitride, Ti, TiN, Al, aluminum oxide, or SiON, among others.

Moreover, embodiments of the present disclosure provide a method for forming a semiconductor pattern, where the method includes forming a first material layer on a semiconductor substrate, forming a second material layer on top of the first material layer (e.g., where the second material layer is a silicon hardmask), forming a third material layer on top of the second material layer (e.g., where the third material layer is a photoresist), and forming the photoresist pattern by photolithography. In some examples, the photoresist pattern may be used as an etch mask in a subsequent etching processes, for example to transfer the pattern of the patterned resist layer to an underlying material layer (e.g., to form the semiconductor pattern). Alternatively, the resist pattern may be used as an ion implantation mask in a subsequent ion implantation process applied to the underlying material layer. In some cases, the photoresist may include a polymer, a metal complex, a multi-metallic complex, a PAG, a quencher (base), and/or a solvent. In some examples, the multi-metallic photoresist is a negative tone photoresist. By way of example, the negative tone multi-metallic photoresist complex may include at least one of crosslinkable groups or reactive sites and at least two different kinds of metals. In some embodiments, some of the metals (e.g., of the multi-metallic resist) will absorb EUV photons after optical exposure, while others of the metals will enhance EUV absorption or activate crosslinkable groups or reactive sites. In some cases, some of the metals may also help generate more secondary electrons and function as a communicator between absorbers and reactive sites. In various embodiments, the excited (e.g., EUV exposed) metal complexes will catalyze the cross-linking reaction. In various examples, after the metal complexes crosslink, the metal complexes may become a very large (huge) polymer. In some embodiments, after the polymer becomes a larger MW polymer, the polymer may not be dissolvable by an organic solvent, for example, such as normal butyl acetate or by a water solution. In some embodiments, the multi-metallic complex is an organometallic complex. In some cases, the multi-metallic complex has at least one kind of metal atom which can absorb EUV light (e.g., the second metal 'M2'), such as Ce, La, Sb, Bi, Pb, Hf, Zr, Ti, Cr, W, Mo, Fe, Ru, Os, Co, Rh, Ir, Ni, Pd, Pt, Cu, Ag, Au, Zn, Cd, Al, Ga, Tl, Ge, Sn, Pb, and/or Bi. In some examples, the multi-metallic complex has at least one kind of metal atom which can enhance EUV absorption or activate crosslinkable groups or reactive sites (e.g., the first metal 'M1'), and which may also help generate more secondary electrons and function as a communicator between absorbers and reactive sites, such as Ce, La, Sb, Bi, Pb, Hf, Zr, Ti, Cr, W, Mo, Fe, Ru, Os, Co, Rh, Ir, Ni, Pd, Pt, Cu, Ag, Au, Zn, Cd, Al, Ga, Tl, Ge, Sn, Pb, and/or Bi. In some embodiments, the photoresist may further include a surfactant, a chromophore, and/or a cross linker. By way of example, the multi-metallic complex has a M.W. of about 100~10000. In some embodiments, this MW value may correspond to the "larger MW polymer" described above.

Still other embodiments of the present disclosure provide a method for forming a semiconductor pattern, where the method includes forming a first material layer on a semiconductor substrate, forming a second material layer on top of the first material layer (e.g., where the second material layer is a silicon hardmask), forming a third material layer on top of the second material layer (e.g., where the third material layer is a photoresist), and forming the photoresist pattern by photolithography. In some examples, the photoresist pattern may be used as an etch mask in a subsequent etching processes, for example to transfer the pattern of the patterned resist layer to an underlying material layer (e.g., to form the semiconductor pattern). Alternatively, the resist pattern may be used as an ion implantation mask in a subsequent ion implantation process applied to the underlying material layer. In some embodiments, the photoresist includes at least a polymer, a metal complex, a multi-metallic complex, a PAG, a quencher (base), and/or a solvent. In some cases, the multi-metallic complex used in the photoresist contains crosslinking groups, where the crosslinking groups may be organic, inorganic, or a blend of organic/inorganic groups. In some embodiments, the organic and inorganic crosslinking groups may crosslink by acid-catalyzed reactions from under about 80° C. to about 300° C. in the exposed area. In some examples, the structure (e.g., the crosslinking group) may include a non-cyclic structure and/or a cyclic structure, and a cyclic structure may be an aromatic, and a non-aromatic ring. In some examples, the structure may contain a functionalized group such as —I, —Br, —Cl, —NH2, —COOH, —OH, —SH, —N3, —S(=O)—, alkene, alkyne, imine, ether, vinyl ether, acetal, hemiacetal, ester, aldehyde, ketone, amide, sulfone, acetic acid, cyanide, and/or allene. In some cases, the crosslinking group is a light sensitive group and the crosslinking bond may form by an irradiation processes in the exposed area. The crosslinking group may include a C3-C20 alkyl group with at least one light-sensitive functional group such as epoxy, azo compounds, alkyl halide, imine, alkene, alkyne, peroxide, ketone, aldehyde, allene, aromatic groups or heterocyclic groups. In some embodiments, the aromatic structures may include phenyl, napthlenyl, phenanthrenyl, anthracenyl, phenalenyl, and/or other aromatic derivatives containing one to five-membered rings. In some embodiments, the multi-metallic complex which may crosslink (e.g., upon exposure to EUV light) contains chelating ligands. For example, the chelating ligands may be of a specific type such as M-OR, M-OOCR, M-OC(=O)OR, M-Cl, M-Br, M-NR3, M-PR3, M-AsR3, M-SbR3, M-CN, M-SR, M-C(=O)R, M-N(R)—C(=O)R, M-CR=CRR, M-R, EDTA, bidentate, tridentate, hexadentate and/or polydentate ligands.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods to improve resist performance by using lithographic light sources (e.g., EUV light) more efficiently. For example, in some embodiments, a non-CAR, multi-metallic resist is provided, where the multi-metallic resist provides for improved light absorption (e.g., EUV light absorption) while also increasing the etch selectivity of the multi-metallic resist. In some embodiments, a multi-metal complex is used as a resist center to increase the EUV absorption of the resist. Moreover, embodiments disclosed herein provide a resist composition including more than one EUV absorbing metal atom (e.g., such as more than one Sb atom) to increase the EUV light absorption of the non-CAR multi-metallic EUV resist, thereby improving the sensitivity of the resist. In particular, the present disclosure provides at least five types of multi-metal complexes useful for resist formation (e.g., EUV resist formation), as described above. In some embodiments, the multi-metal complex includes metal atoms that attach to one another. In some cases, the multi-metal complex includes metal atoms that attach to one another through an ionic bond. In some embodiments, the multi-metal complex includes some metal atoms that attach to each other and some metal atoms that separate through ligands. In some cases, the multi-metal complex includes all the metal atoms separated through ligands. As mentioned above, at least some advantages of the embodiments disclosed herein include improvement of EUV resist sensitivity and high etch selectivity. In addition, in some embodiments, secondary electrons generated by EUV absorption may transfer through chemical bonds and space, further improving the efficacy of the multi-metal complexes disclosed herein. Thus, embodiments of the present disclosure server to overcome various shortcomings of at least some current resist compositions and methods.

Thus, one of the embodiments of the present disclosure described a method that includes providing a substrate and forming a resist layer over the substrate. In various embodiments, the resist layer includes a multi-metal complex including an extreme ultraviolet (EUV) absorption element and a bridging element. By way of example, the EUV absorption element includes a first metal type and the bridging element includes a second metal type. In some embodiments, an exposure process is performed to the resist layer. After performing the exposure process, the exposed resist layer is developed to form a patterned resist layer.

In another of the embodiments, discussed is a method where a first material layer is deposited on a semiconductor substrate. Thereafter, in some embodiments, a second material layer is formed on the first material layer. In some cases, the second material layer includes a silicon hardmask. In various examples, a third material layer is then formed on the second material layer, where the third material layer includes a photoresist. In some embodiments, the photoresist includes a multi-metal complex. In some embodiments, a photoresist pattern is then formed, for example, by a photolithography process.

In yet another of the embodiments, discussed is a method of semiconductor device fabrication including providing a substrate and forming a resist layer over the substrate, where the resist layer includes a multi-metal complex. In various embodiments, the multi-metal complex includes a first metal type and a second metal type, where the first metal type includes an extreme ultraviolet (EUV) absorption element and the second metal type includes a bridging element. In some cases, an exposure process is performed to the resist layer, where the exposure process is performed using an EUV light source and projected onto the resist layer through an intervening mask that includes a circuit pattern. In some cases, the circuit pattern includes one or more FinFET device circuit patterns. In various embodiments, after performing the exposure process, the exposed resist layer is developed to form a patterned resist layer, where the patterned resist layer includes the circuit pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a substrate;
   forming a resist layer over the substrate, wherein the resist layer includes metal-containing nanoparticles, wherein the resist layer includes a multi-metal complex including an extreme ultraviolet (EUV) absorption element and a bridging element, wherein the EUV absorption element includes a first metal type and the bridging element includes a second metal type, and wherein each metal atom of the multi-metal complex is separated from other metal atoms of the multi-metal complex by at least one ligand;
   performing an exposure process to the resist layer, wherein responsive to the exposure process, a first ligand of the multi-metal complex is replaced by a second ligand, wherein the first ligand is not configured to participate in a cross-linking reaction, and wherein the second ligand is configured to participate in the cross-linking reaction; and after performing the exposure process, developing the exposed resist layer to form a patterned resist layer.

2. The method of claim 1, wherein the EUV absorption element includes a plurality of atoms of the first metal type.

3. The method of claim 1, wherein the bridging element performs at least one of EUV absorption enhancement and activation of cross-linkable groups or reactive sites.

4. The method of claim 1, wherein at least one of the EUV absorption element and the bridging element serves to generate secondary electrons used for activation of cross-linkable groups or reactive sites.

5. The method of claim 1, wherein the EUV absorption element includes at least two antimony atoms, and wherein the bridging element includes a ruthenium atom that bridges the at least two antimony atoms.

6. The method of claim 5, wherein styrene is attached to an antimony atom of the at least two antimony atoms or to the ruthenium atom.

7. The method of claim 1, wherein the bridging element acts as a bridge between two EUV absorption element atoms, between an EUV absorption element atom and a ligand, and/or between two ligands.

8. The method of claim 1, further comprising: as a result of performing the exposure process to the resist layer, cross-linking the multi-metal complex to another multi-metal complex.

9. The method of claim 1, further comprising: after forming the patterned resist layer, performing a fabrication process to the substrate through an opening of the patterned resist layer.

10. The method of claim 1, wherein the resist layer includes a ruthenium vinylidene complex.

11. The method of claim 10, wherein the ruthenium vinylidene complex includes cyclopentadienyl and an $Sb(R)_3$ ligand.

12. The method of claim 1, wherein the resist layer is a non-chemically amplified resist (non-CAR) layer.

13. The method of claim 1, wherein the second ligand includes an activated ligand.

14. A method of semiconductor device fabrication, comprising:
provide a transparent mask substrate, wherein the transparent mask substrate includes quartz;
depositing an absorber layer over the transparent mask substrate, wherein the absorber layer includes a chromium layer;
after depositing the absorber layer, forming a resist layer over the absorber layer, wherein the resist layer includes a ruthenium vinylidene complex, wherein the resist layer includes a multi-metal complex including a first metal type and a second metal type, wherein the first metal type includes an extreme ultraviolet (EUV) absorption element and the second metal type includes a bridging element, and wherein each metal atom of the multi-metal complex is separated from other metal atoms of the multi-metal complex by at least one ligand;
after forming the resist layer, patterning the resist layer using an exposure process and a development process to provide a patterned resist layer having openings that expose the absorber layer, wherein responsive to the exposure process, a first ligand of the multi-metal complex is replaced by a second ligand, wherein the first ligand is not configured to participate in a cross-linking reaction, and wherein the second ligand is configured to participate in the cross-linking reaction;
after forming the patterned resist layer, patterning the absorber layer through the openings in the patterned resist layer to provide a patterned absorber layer on the transparent mask substrate, wherein the patterned absorber layer defines a circuit pattern, and wherein the patterned absorber layer and the transparent mask substrate provide an EUV mask; and
using the EUV mask as part of a photolithography process to pattern a semiconductor substrate, wherein the photolithography process transfers the circuit pattern from the EUV mask to the semiconductor substrate.

15. The method of claim 14, wherein the multi-metal complex includes crosslinking groups, and where the crosslinking groups are organic, inorganic, or a blend of organic/inorganic groups.

16. The method of claim 14, wherein the multi-metal complex includes one or more chelating ligands of a ligand type including M-OR, M-OOCR, M-OC(=O)OR, M-Cl, M-Br, M-NR3, M-PR3, M-AsR3, M-SbR3, M-CN, M-SR, M-C(=O)R, M-N(R)—C(=O)R, M-CR=CRR, M-R, EDTA, bidentate, tridentate, hexadentate, and/or polydentate.

17. The method of claim 14, wherein the circuit pattern includes one or more FinFET device circuit patterns.

18. The method of claim 14, wherein the ruthenium vinylidene complex includes cyclopentadienyl and an $Sb(R)_3$ ligand.

19. The method of claim 14, wherein the resist layer includes metal-containing nanoparticles.

20. The method of claim 14, wherein the second ligand includes an activated ligand.

* * * * *